(12) United States Patent
Crocker

(10) Patent No.: US 6,301,168 B1
(45) Date of Patent: Oct. 9, 2001

(54) CMOS CELL AND CIRCUIT DESIGN FOR IMPROVED IDDQ TESTING

(75) Inventor: Paul R. Crocker, Austin, TX (US)

(73) Assignee: Motorola, Inc., Scnaumburg, IL (US)

(*) Notice: Subject to any disclaimer, the term of this patent is extended or adjusted under 35 U.S.C. 154(b) by 0 days.

(21) Appl. No.: 09/645,031

(22) Filed: Aug. 23, 2000

(51) Int. Cl.$^7$ ........................................ G11C 7/00
(52) U.S. Cl. ............... 365/201; 324/763; 324/765; 324/769; 714/718
(58) Field of Search ........................ 324/763, 765, 324/769; 365/201; 714/733, 718

(56) References Cited

U.S. PATENT DOCUMENTS 6,144,214 * 11/2000 Athan ............................. 365/763
6,184,048 * 2/2001 Ramon ............................ 324/522

* cited by examiner

Primary Examiner—Richard Elms
Assistant Examiner—Van Thu Nguyen

(57) ABSTRACT

A CMOS cell and circuit design methodology for improved IDDQ testing for logic and memory circuits. The CMOS cell library includes one or more CMOS cells, each including one or more PMOS and NMOS transistors. Each CMOS cell is configured to assert its outputs high during a high test portion of a test mode in which each input is asserted high. Each CMOS cell is configured to assert its outputs low during a low test portion of the test mode in which each input is asserted low. At least one CMOS cell of the library includes one or more test transistors, each test transistor receiving one of first and second test inputs. The test inputs indicate a normal mode, a high test mode and a low test mode. In this manner, each CMOS cell is configured so that each gate oxide interface of each transistor of the CMOS cell receives a test voltage during the test mode. A CMOS circuit may be implemented in a similar manner including primary inputs and one or more test transistors, each receiving one of the first and second test inputs. A memory device may be configured in a similar manner with address logic that simultaneously asserts the word line signals to test each memory cell of a memory array during an IDDQ test.

16 Claims, 17 Drawing Sheets

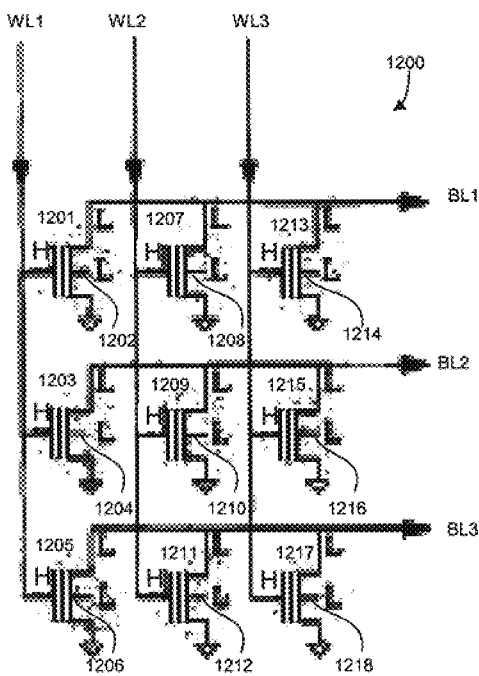 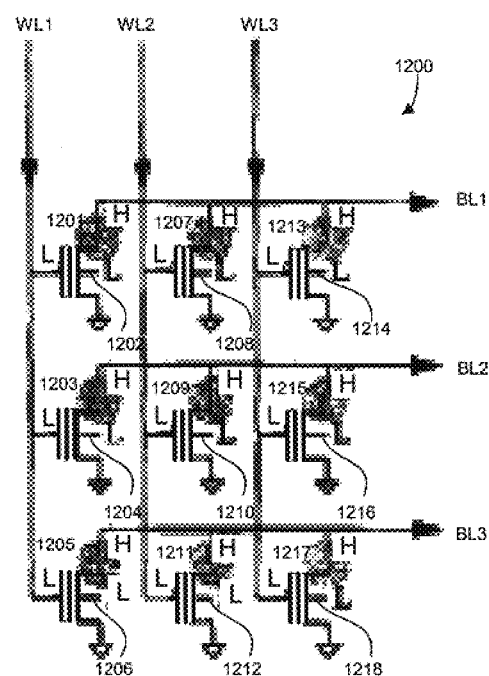
FIG. 12A                    FIG. 12B

CMOS CELL AND CIRCUIT DESIGN FOR IMPROVED IDDQ TESTING

FIELD OF THE INVENTION

The present invention relates to CMOS technology and IDDQ test methodology, and more particularly to CMOS cell and circuit design for improved IDDQ testing of CMOS logic circuits and CMOS memories.

RELATED ART

CMOS is the technology of choice for many circuit and system designers for various reasons, including low quiescent power dissipation and potentially high speed operation. It is noted that although CMOS technology originally referred to devices made with metal, the terms "CMOS", "PMOS", "NMOS" and "MOS-type" refer generally to all types of CMOS technology including those made more recently with poly-crystalline silicon, or polysilicon, rather than metal. As with any logic circuit or functional system, a design implemented with CMOS technology must be tested to insure proper operation. Many different type of tests are employed for verifing circuit operation and integrity. For example, many different types of functional tests are employed to ensure proper functional operation of the logic circuit. For memory arrays or circuits, many different types of memory tests are known for testing the functional aspects of the memory cells.

For CMOS circuits including logic and memory circuits, one particular type of test is known as static Idd test or the IDDQ test. During the typical IDDQ test, power is applied via power supply voltage terminals and a multitude of test vectors are applied at the inputs while the quiescent drain current of the circuit is measured or otherwise sampled. Even for relatively large circuits, such as Very Large Scale Integration (VLSI) circuits or the like including thousands or millions of transistors, the static drain current should be relatively low. If the sampled current of the circuit is appreciably high for any particular test vector, then the device under test fails the IDDQ test.

In particular, the CMOS circuit includes NMOS and PMOS transistors, each with gate-to-source, gate-to-drain and gate-to-substrate interfaces, collectively referred to as the gate oxide interfaces. These gate oxide interfaces are substantially capacitive in nature and normally draw a very low amount of drain current when a test voltage is applied across the interface. If the gate oxide interface fails for any reason, it typically becomes a resistive interface with a low resistance so that it draws a significantly high level of current when voltage is applied. The IDDQ test is utilized in an attempt to identify any failed portions of a CMOS circuit including any failed gate oxide interfaces. A single failed gate oxide interface causes failure of the entire CMOS circuit if it receives a test voltage during the IDDQ test.

A substantial problem of the IDDQ test for CMOS technology is that it is difficult, if not virtually impossible, to test each gate oxide interface of each transistor. The inputs to the logic circuit, generally referred to as the primary inputs, do not access every transistor or even every logic cell or macro cell within the CMOS circuit. For this reason, test engineers attempt to test as many gate oxide interfaces as possible by utilizing a multitude of test vectors applied at the primary inputs. For most circuits, however, particularly large circuit designs, a prohibitive number of test vectors would have to be applied at the primary inputs to test every gate oxide interface of the circuit. Test methodologies have been designed and utilized to minimize the number of test vectors and to simultaneously maximize the number of gate oxide interfaces that are tested during the IDDQ test. Nonetheless, even the most aggressive test methodologies utilize hundreds or thousands of test vectors thereby consuming an appreciable amount of time to conduct the IDDQ test. Furthermore, virtually none of the these test methodologies is capable of testing all gate oxide interfaces. A CMOS circuit with a failed gate oxide interface may not receive a test voltage during the IDDQ test in spite of the multitude of test vectors, and thereby go undetected.

BRIEF DESCRIPTION OF THE DRAWINGS

The present invention is illustrated by way of example and not limitation in the accompanying figures, in which like references indicate similar elements, and in which:

FIGS. 12A and 12B are schematic diagrams of a portion of an exemplary EPROM during an IDDQ test.

Figures 1A, 1B:
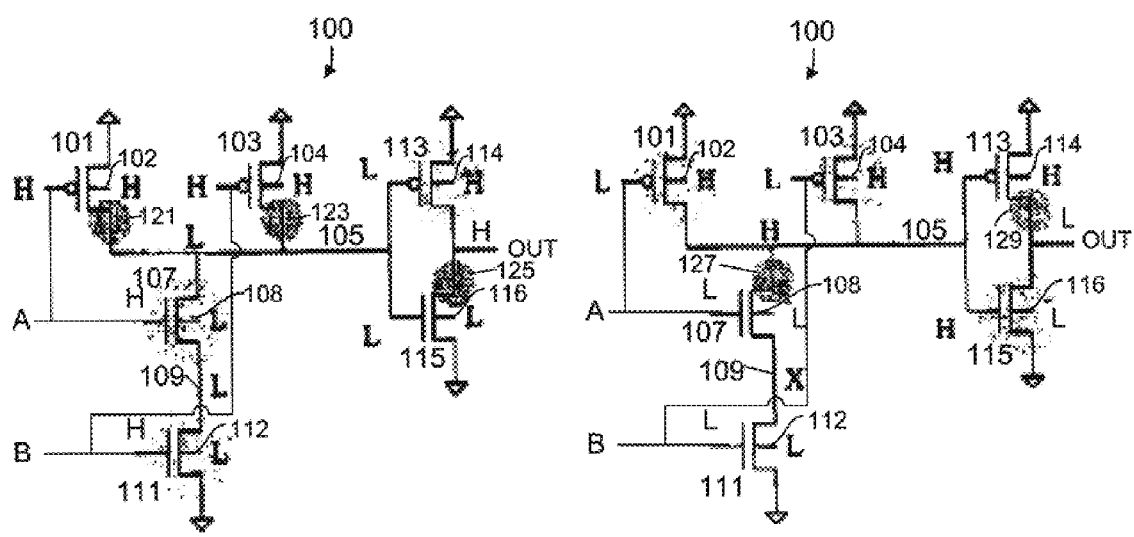
FIGS. 1A and 1B are schematic diagrams of an exemplary two-input AND gate illustrating an exemplary IDDQ test criterion for testing the integrity of the gate oxide interfaces of MOS-type transistors of a typical CMOS cell.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

As used herein, the terms "assert" and "negate" are used when referring to the rendering of a signal, status bit, or similar apparatus into its logically true or logically false state, respectively. For positive logic, the logically true state is a logic level one (1) and the logically false state is a logic level zero (0). And for negative logic, the logically true state is a logic level zero and the logically false state is a logic level one. A logic one level also represents a high voltage level that is referenced in the Figures with a capital "H" and a logic zero level represents a low voltage level that is referenced in the Figures with a capital "L". A capital "X" indicates a "don't care" or "don't know". The differential between H and L across a junction or between terminals is considered as a test voltage. Signal names conform to positive logic. A signal name with a bar "b" or "B" appended thereto indicates that the signal is the logically opposite or inverted version of a related logic signal. For example, a "non-inverted" bit line signal named BLx may have an "inverted" version named BLxB, although the signal pairs themselves may conform to positive or negative logic as desired.

The present invention is illustrated using Complementary Metal Oxide Semiconductor (CMOS) technology comprising Positive-channel MOS (PMOS) and Negative-channel MOS (NMOS) transistors. It is understood that although CMOS technology originally referred to devices made with metal, the terms CMOS, PMOS and NMOS refer generally to all types of CMOS technology including those made more recently with poly-crystalline silicon, or polysilicon, rather than metal. Each PMOS and NMOS transistor described herein includes gate, source and drain terminals as commonly used in the industry. The drain and source terminals referenced herein are not identified with respect to each other for simplicity of explanation. It is noted, however, that the drain and source terminals in any configuration are coupled in the appropriate manner to perform the indicated function, as readily understood by those having skill in the art of CMOS logic design. Each transistor also includes a substrate terminal shown between the drain and source terminals. Although the substrate terminals are not coupled or used to perform any particular logic function, they are nonetheless shown as it is desired to test the interface between the gate terminal and the substrate terminal for each transistor. In general, during each IDDQ test, it is desired to test the gate-to-source interface, the gate-to-drain interface, and the gate-to-substrate terminal interface of each transistor, where these gate interfaces are generally referred to herein as the gate oxide interfaces.

FIGS. 1A and 1B are schematic diagrams of an exemplary two-input AND gate 100 illustrating an exemplary test method for testing the integrity of all of the gate oxide interfaces of all MOS-type transistors of a typical CMOS cell. FIG. 1A illustrates the AND gate 100 with its inputs asserted high (H) and its output at a logic high (H) level. Each of the logic and memory circuits described herein receive power via voltage terminals Vdd (illustrated with upward directed arrows) and Vss (illustrated with downward directed arrows similar to a ground symbol). An appropriate voltage level, such as, for example, 2.2 volts, 3.3 volts, 5 volts, 12 volts, etc., applied across the Vdd and Vss terminals supplies the necessary power to the circuitry to perform its intended functions.

A first input node denoted "A" is coupled to the gate terminal of a PMOS transistor 101 and to the gate terminal of an NMOS transistor 107. A second input node "B" is coupled to the gate terminal of a PMOS transistor 103 and to the gate terminal of an NMOS transistor 111. The drain and source terminals of both of the PMOS transistors 101 and 103 are coupled between Vdd and node 105. The drain and source terminals of the NMOS transistor 107 are coupled between nodes 105 and 109. The drain and source terminals of the NMOS transistor 111 are coupled between node 109 and Vss. The node 105 is provided to the gate terminals of a PMOS transistor 113 and an NMOS transistor 115. The drain and source terminals of the PMOS transistor 113 are coupled between Vdd and an output node denoted "OUT". The OUT node is considered the output of the AND gate 100 for asserting the output signal. The drain and source terminals of the NMOS transistor 115 are coupled between the OUT node and Vss. substrate terminals 102, 104, 108, 112, 114 and 116 are shown for each of the transistors 101, 103, 107, 111, 113 and 115, respectively.

As shown in FIG. 1A, the "primary" inputs A and B of the AND gate 100 are asserted high, which causes the output node OUT to be asserted high. In this configuration, a test voltage is applied across each of the gate oxide interfaces of the NMOS transistors 107 and 111 and the PMOS transistor 113. In particular, for each NMOS transistor 107 and 111, the gate terminal is asserted at logic high, whereas the drain and source terminals and the substrate terminal are all asserted low. The gate terminal of the PMOS transistor 113 is asserted low, whereas the drain and source terminals and the substrate terminal 114 of the PMOS transistor 113 are all asserted high. The same is not true for the transistors 101, 103 and 115.

FIG. 1B illustrates the AND gate 100 with its inputs asserted low (L) and its output node OUT asserted at a logic low (L) level. In this case, the gate oxide interfaces of the remaining transistors 101, 103 and 115 receive a test voltage. In particular, the gate terminals of the PMOS transistors 101, 103 are asserted low, whereas the drain and source terminals and the respective substrate terminals 104, 114 of the PMOS transistors 101 and 103 are asserted high. In a similar manner, the gate terminal of the NMOS transistor 115 is asserted high whereas the drain and source terminals and the substrate terminal 116 of the NMOS transistor 115 are asserted low.

FIGS. 1A and 1B illustrate that for the CMOS configured AND gate 100, all of the gate oxide interfaces receive a test voltage when the primary inputs A and B are first asserted high until the output is asserted high, and when the primary inputs are asserted low until the output is asserted low. The AND gate 100 is a relatively simple configuration with a non-inverting logic operation, so that it conforms to the parameters of the IDDQ test described herein without further modification.

Dark shading over a P-N junction denotes that the reverse-biased P-N junction receives a test voltage. In particular, as shown in FIG. 1A, reversed-biased P-N junctions 121, 123 and 125 of corresponding transistors 101, 103 and 115 receive a test voltage during the high test. As shown in FIG. 1B, reversed-biased P-N junctions 127 and 129 of corresponding transistors 107 and 113 receive a test voltage during the low test. Note that not all P-N junctions received the reversed-biased voltage. It is possible to reverse-bias each P-N junction by taking the bulk and well voltages outside of the normal power supply rails during the IDDQ test. For example, in one embodiment, the P-well voltage is taken to −1V during the high test.

Figure 2A:
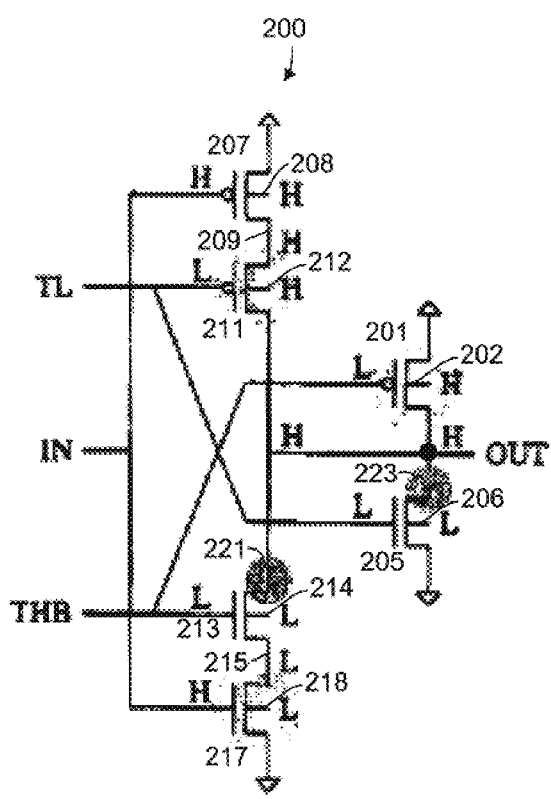
FIGS. 2A and 2B are schematic diagrams of an exemplary inverter implemented to meet the IDDQ test criteria described herein.
Figure 2B:
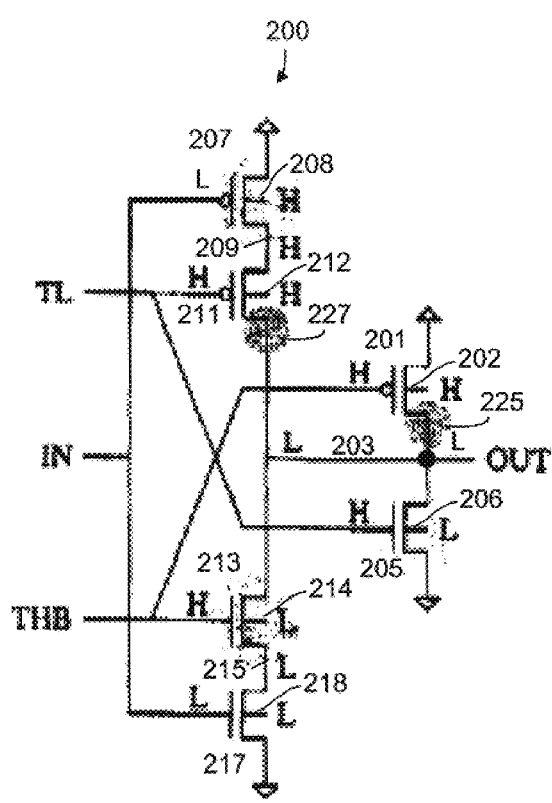

FIGS. 2A and 2B are schematic diagrams of an exemplary inverter 200 implemented to meet the IDDQ test criteria described herein. The inverter 200 includes a PMOS transistor 201 having its drain and source terminals coupled between Vdd and an output node OUT and an NMOS transistor 205 having its drain and source terminals coupled between the output node OUT and Vss. For a standard CMOS inverter, the gate terminals of the transistors 201 and 205 would be the input to perform the logic inverter function at the output node OUT. To meet the IDDQ test, however, it is desired that the output go high when the primary inputs are asserted high and that the output go low when the inputs are low. The typical inverting function would otherwise defeat the IDDQ test criterion. Additional test transistors are added and coupled to the standard inverter so that it performs its normal inverting function during normal operation and so that it meets the IDDQ test criterion during IDDQ test. As described further below, the additional test transistors are also tested in accordance with the IDDQ test, so that the entire inverter 200 is tested.

In particular, a PMOS transistor 207 has its drain and source terminals coupled between Vdd and node 209 and another PMOS transistor 211 has its drain and source terminals coupled between node 209 and an output node denoted "OUT". An NMOS transistor 213 has its drain and source terminals coupled between the output node OUT and node 215 and another NMOS transistor 217 has its drain and source terminals coupled between node 215 and Vss. An input node, denoted "IN", is coupled to the gate terminals of the transistors 207 and 217. A test low (TL) signal is provided to the gate terminals of the transistors 211 and 205 and a test high bar "THB" signal is provided to the gate terminals of the transistors 201 and 213.

The inverter 200 operates as a standard inverter when the TL signal is asserted low and the THB signal is asserted high for normal operation. In particular, the output node OUT is asserted high when the input node IN is asserted low and the output node OUT is asserted low when the input node IN is asserted high. When the TL and THB signals are asserted low as shown in FIG. 2A, however, a high test is indicated in which the output node OUT goes high when the input node IN is asserted high. Also, when the TL and THB signals are both high as shown in FIG. 2B, a corresponding low test is indicated in which the output node OUT goes low when the input node IN is asserted low. All of the gate oxide interfaces of each transistor of the inverter 200 receive a test voltage after completion of both the high and low tests.

During the high test shown in FIG. 2A in which the TL and THB signals are low and the input node IN is asserted high, the gate oxide interfaces of the transistors 211, 201 and 217 receive a test voltage. In particular, the gate terminals of the PMOS transistors 201 and 211 are low, whereas the drain and source terminals and the respective substrate terminals 202, 212 of the PMOS transistors 201, 211 are asserted high. Also, the gate terminal of the NMOS transistor 217 is asserted high, whereas its drain and source terminals and its substrate terminal 218 are asserted low.

During the low test shown in FIG. 2B in which the TL and THB signals are both high and the input node IN is asserted low, the output node OUT also goes low. In this configuration, the PMOS transistor 207 and the NMOS transistors 203 and 213 receive test voltages. In particular, the gate terminal of the PMOS transistor 207 is asserted low whereas its drain and source terminals and its substrate terminal 208 are asserted high. In a similar manner, the gate terminals of the NMOS transistors 205, 213 are asserted high whereas the drain and source terminals and the respective substrate terminals 206, 214 of the NMOS transistors 203, 213 are asserted low. In this manner, the gate oxide interfaces of all of the transistors 201, 203, 207, 211, 213, and 217 receive test voltages during the high test of FIG. 2A and the low test of FIG. 2B.

Again, dark shading over a P-N junction denotes that the reverse-biased P-N junction receives a test voltage. In particular, as shown in FIG. 2A, the reversed-biased P-N junctions 221 and 223 of corresponding transistors 213 and 205 receive a test voltage during the high test. As shown in FIG. 2B, reversed-biased P-N junctions 225 and 227 of corresponding transistors 201 and 211 receive a test voltage during the low test. Again, not all P-N junctions received the reversed-biased voltage, although it is possible to do so by taking the bulk and well voltages outside of the normal power supply rails as previously described.

Figure 3A:
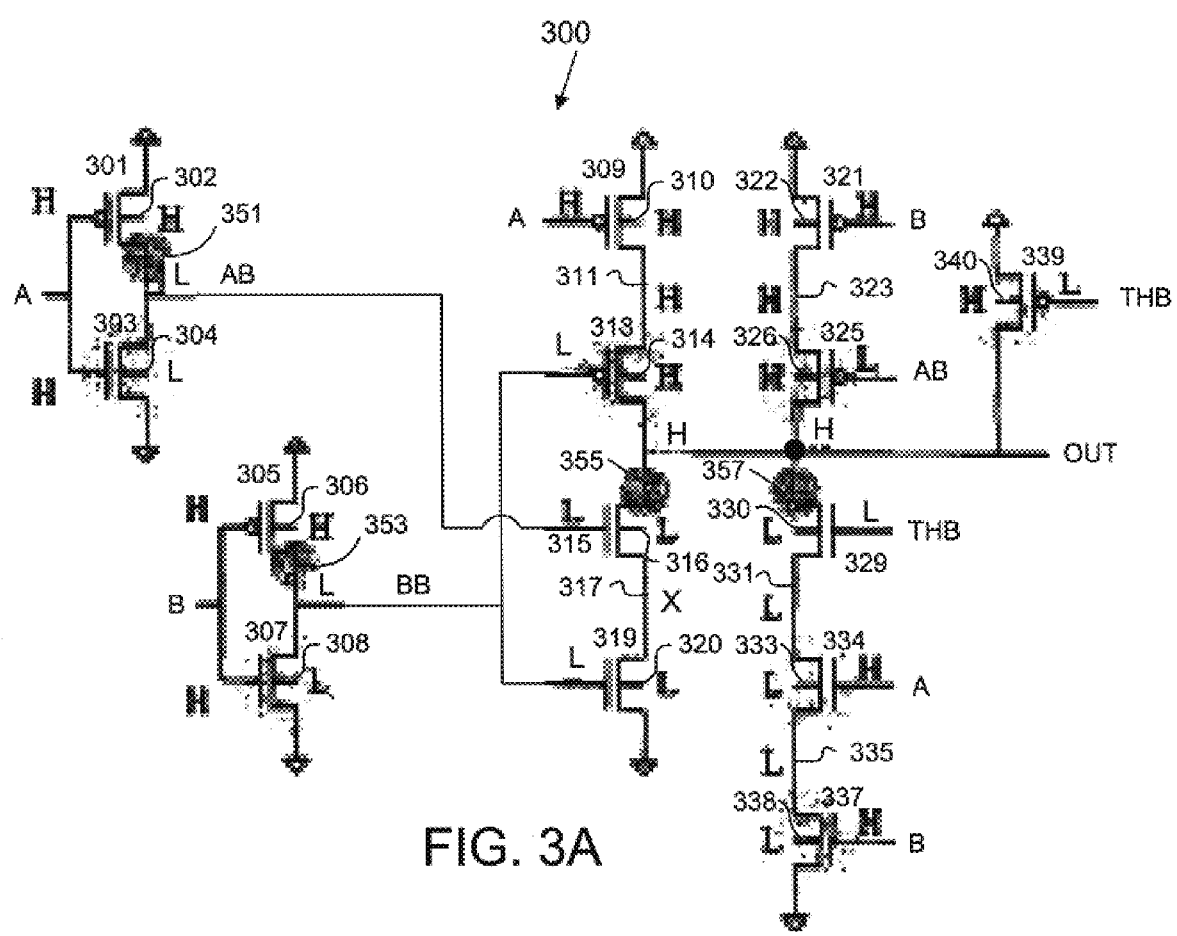
FIGS. 3A and 3B are schematic diagrams of an exemplary two-input exclusive OR (XOR) gate implemented to meet the IDDQ test criteria described herein.
Figure 3B:
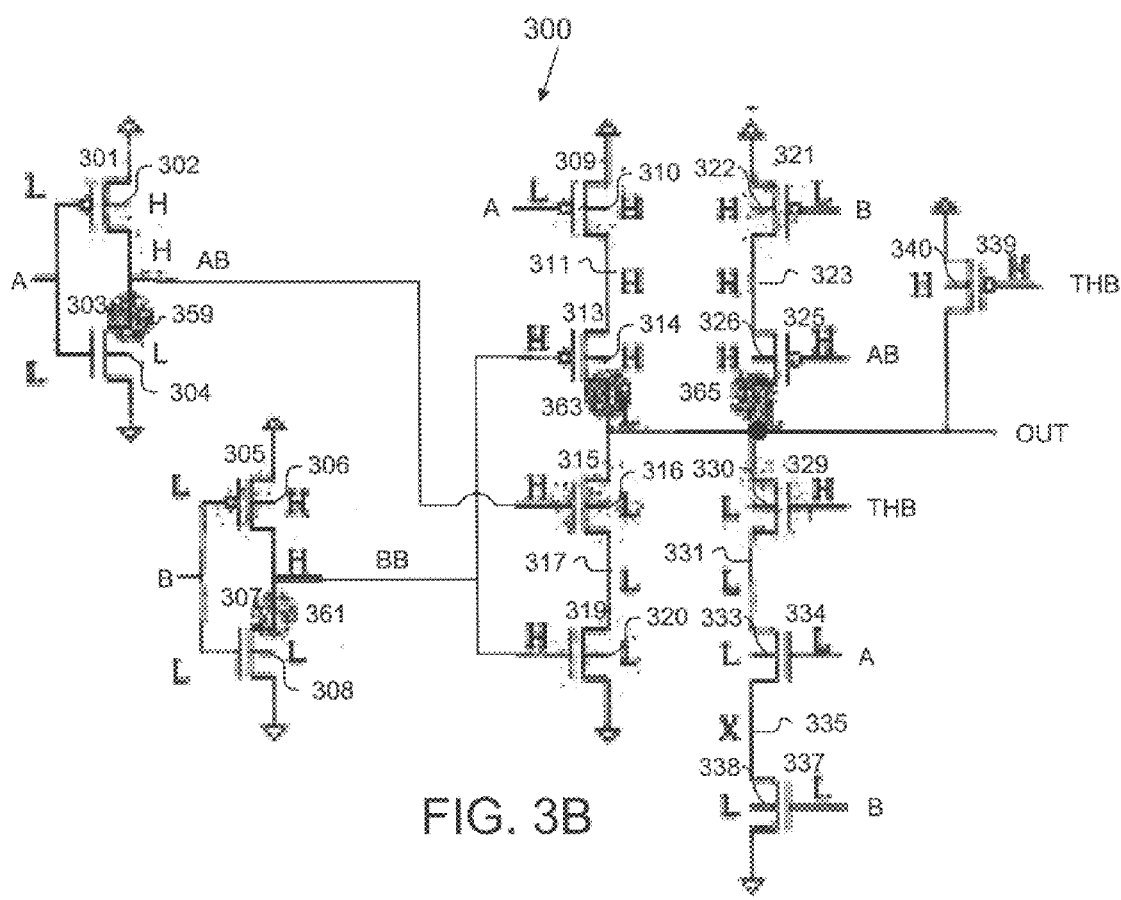

FIGS. 3A and 3B are schematic diagrams of an exemplary two-input exclusive OR (XOR) gate 300 implemented to meet the IDDQ test criteria described herein. FIG. 3A illustrates the XOR gate 300 during the high test in which primary inputs A and B are asserted high, which causes an output node "OUT" to go high. Since this is not the normal function of the XOR gate 300, additional test transistors are provided that receive the THB signal asserted low indicating the high test to cause the XOR gate 300 to perform the desired IDDQ test functions. FIG. 3B illustrates the XOR gate 300 during the low test in which the inputs A and B are asserted low, which causes an output node OUT to go low. Although this is the normal function of the XOR gate 300, the test transistors still receive the THB signal negated high during the low test in accordance with the IDDQ test.

As shown in FIG. 3A, a first input node A is coupled to the gate terminals of a PMOS transistor 301 and an NMOS transistor 303. The PMOS transistor 301 has its drain and source terminals coupled between Vdd and a node denoted "AB" and the NMOS transistor 303 has its drain and source terminals coupled between node AB and Vss. The node AB is intended to be an inverted version of the input node A. A second input node B is coupled to the gate terminals of another PMOS transistor 305 and another NMOS transistor 307. The transistors 305, 307 are coupled in an identical manner as the transistors 301, 303 and provide a node "BB" intended as an inverted version of the input node B. Input node A is provided to the gate terminal of a PMOS transistor 309. The node BB is provided to the gate terminals of a PMOS transistor 313 and an NMOS transistor 319. The node AB is provided to the gate terminal of an NMOS transistor 315. The drain and source terminals of the PMOS transistor 309 are coupled between Vdd and node 311. The drain and source terminals of the PMOS transistor 313 are coupled between node 311 and an output node OUT. The NMOS transistor 315 has its drain and source terminals coupled between the output node OUT and node 317. The NMOS transistor 319 has its drain and source terminals coupled between node 317 and Vss.

The input node B is provided to the gate terminals of a PMOS transistor 321 and an NMOS transistor 337. The node AB is provided to the gate terminal of a PMOS transistor 325. The THB signal is provided to the gate terminal of an NMOS test transistor 329. The input node A is provided to the gate terminal of another NMOS transistor 333. The drain and source terminals of the PMOS transistor 321 are coupled between Vdd and node 323. The drain and source terminals of the PMOS transistor 325 are coupled between nodes 323 and the output node OUT. The drain and source terminals of the NMOS transistor 329 are coupled between the output node OUT and node 331. The drain and source terminals of the NMOS transistor 333 are coupled between nodes 331 and 335. The drain and source terminals of the NMOS transistor 333 are coupled between node 335 and Vss. The THB signal is provided to the gate terminal of a PMOS test transistor 339. The drain and source terminals of the PMOS transistor 339 are coupled between Vdd and the output node OUT.

The XOR gate 300 operates normally according to the logic XOR function when the THB signal is negated high. The high test is performed as shown in FIG. 3A in which the primary input nodes A and B are asserted high whereas the THB signal is asserted low. In this manner, the output node OUT goes high in accordance with the high test criteria of the IDDQ test. During the high test, the gate oxide interfaces of each of the transistors 303, 307, 313, 325, 333, 337, and 339 receive test voltages. In particular, the gate terminals of NMOS transistors 303, 307, 333, and 337 are asserted high whereas the drain and source terminals and the respective substrate terminals 304, 308, 334, and 338 are asserted low. Also, the gate terminals of the PMOS transistors 313, 325, and 339, are asserted low whereas the drain and source terminals and the respective substrate terminals 314, 326, and 340 are asserted high.

The corresponding low test is shown in FIG. 3B in which the primary input nodes A and B are asserted low, the THB signal is negated high and the output node OUT goes low. In the low test, the gate oxide interfaces of the remaining transistors 301, 305, 309, 315, 319, 321, and 329 receive test voltages. In particular, the gate terminals of the PMOS transistors 301, 305, 309 and 321 are asserted low, whereas the drain and source terminals and the respective substrate terminals 302, 306, 310, and 322 are asserted high. In a similar manner, the gate terminals of the NMOS transistors 315, 319 and 329 are asserted high whereas the drain and source terminals and the respective substrate terminals 316, 320 and 330 are asserted low. In this manner, all of the gate oxide interfaces of each of the transistors 301–339 receive a test voltage after the high and low tests have been applied according to the IDDQ test.

Again, dark shading over a P-N junction denotes that the reverse-biased P-N junction receives a test voltage. In particular, as shown in FIG. 3A, the reversed-biased P-N junctions 351, 353, 355 and 357 of corresponding transistors 301, 305, 315 and 329 receive a test voltage during the high test. As shown in FIG. 3B, reversed-biased P-N junctions 359, 361, 363 and 365 of corresponding transistors 303, 307, 313 and 325 receive a test voltage during the low test. Again, not all P-N junctions received the reversed-biased voltage, although it is possible to do so by taking the bulk and well voltages outside of the normal power supply rails as previously described.

Figure 4A:
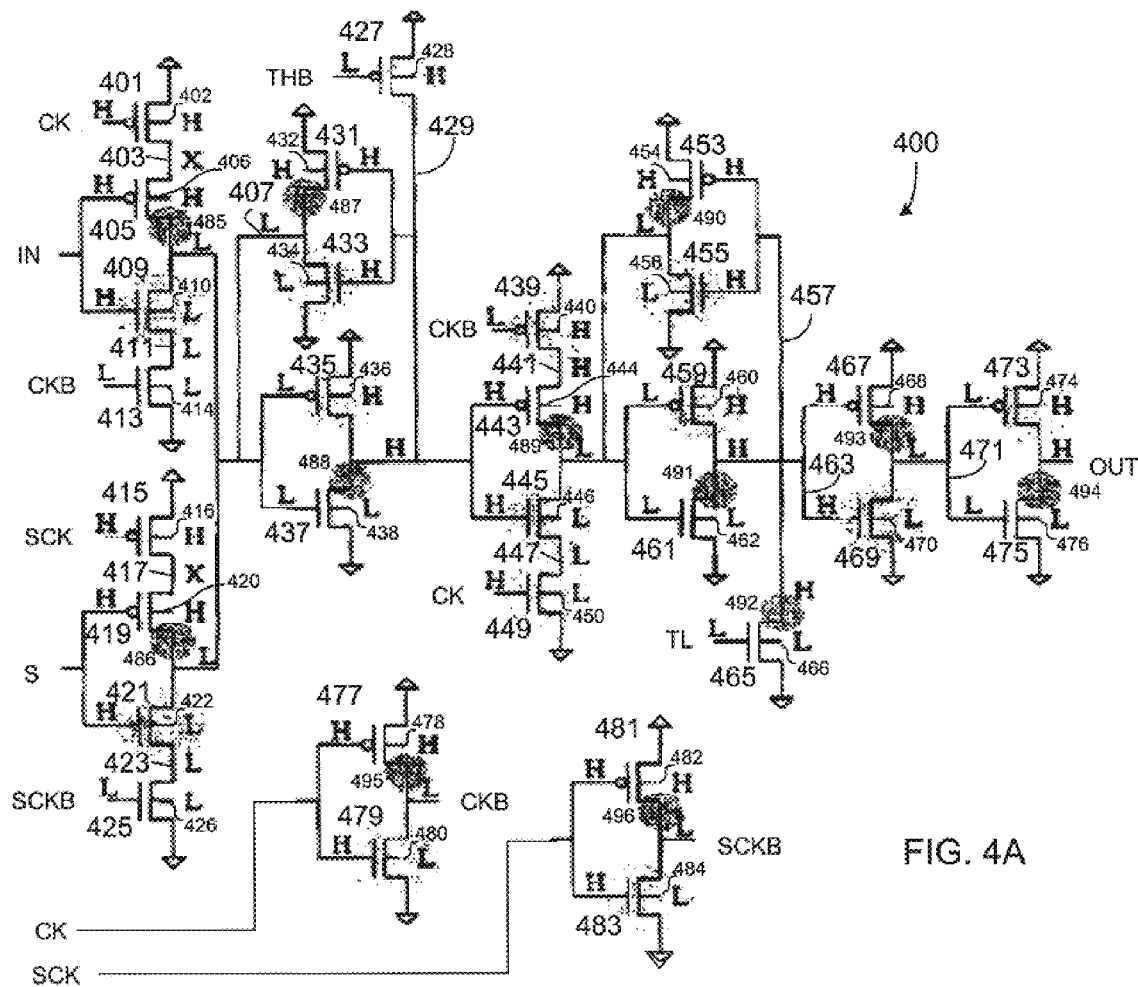
FIGS. 4A and 4B are schematic diagrams of an exemplary scan D-type flip-flop implemented to meet the IDDQ test criterion described herein.
Figure 4B:
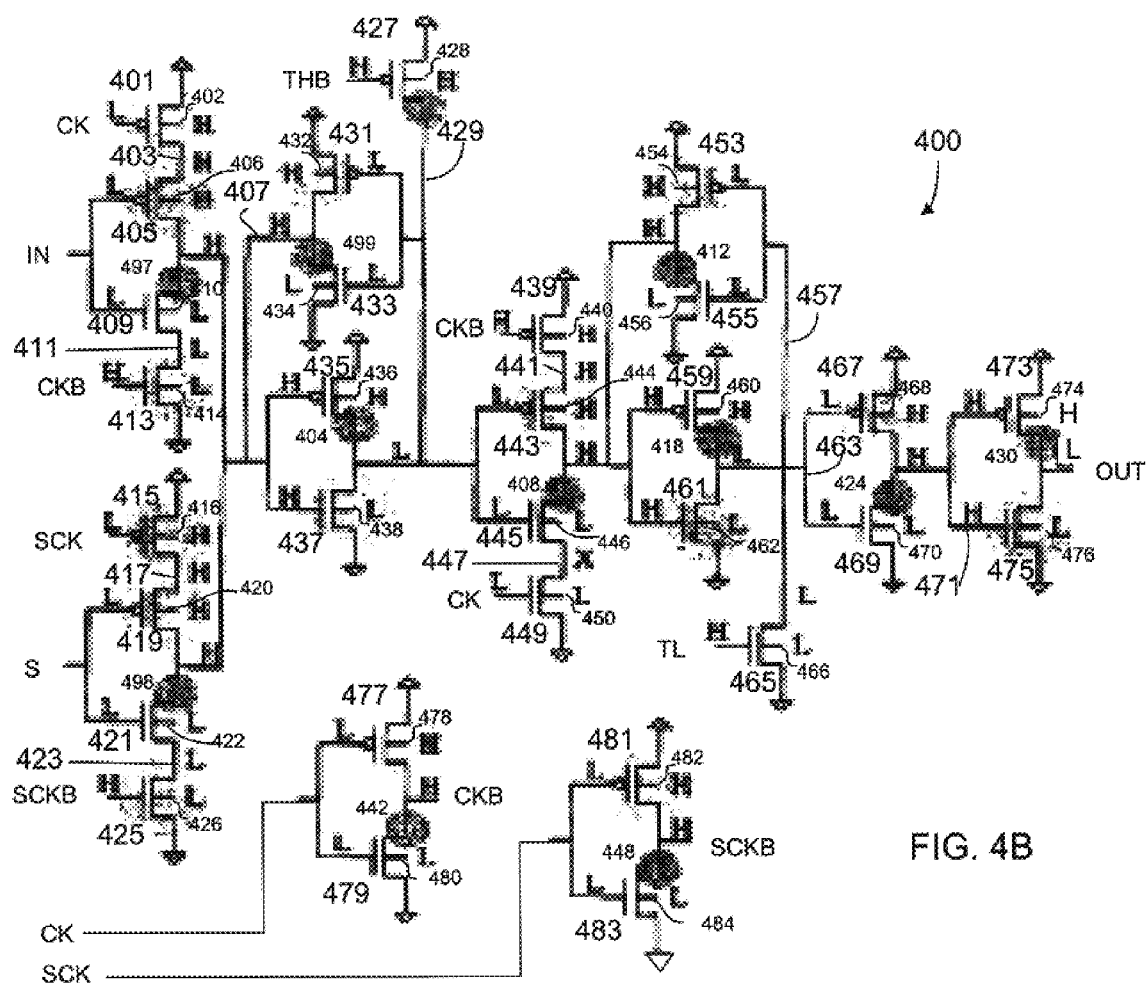

FIGS. 4A and 4B are schematic diagrams of an exemplary scan D-type flip-flop 400 during the high and low tests, respectively, in accordance with the IDDQ test procedure described herein. The flip-flop 400 has several primary inputs, including an input node IN, a scan input denoted "S", a clock input denoted "CK", and a scan clock input denoted "SCK". The flip-flop 400 includes an output node OUT. The input CK is provided to the gate terminals of a PMOS transistor 477 and an NMOS transistor 479. The drain and source terminals of the PMOS transistor 477 are coupled between Vdd and node "CKB" intended as the inverted version of the CK input. The SCK input is provided to the gate terminals of a PMOS transistor 481 and an NMOS transistor 483 coupled in identical manner as the transistors 477,479 to provide an inverting signal "SCKB", intended as an inverted version of the SCK input.

The input node CK is coupled to the gate terminals of a PMOS transistor 401 and an NMOS transistor 449. The input node IN is coupled to the gate terminals of a PMOS transistor 405 and an NMOS transistor 409. The node CKB is coupled to the gate terminals of an NMOS transistor 413 and a PMOS transistor 439. The input node SCK is coupled to the gate terminal of a PMOS transistor 415. The input node S is coupled to the gate terminals of a PMOS transistor 419 and an NMOS transistor 421. The SCKB node is coupled to the gate terminal of an NMOS transistor 425.

The drain and source terminals of the PMOS transistor 401 are coupled between Vdd and node 403. The drain and source terminals of the PMOS transistor 405 are coupled between nodes 403 and 407. The drain and source terminals of the NMOS transistor 409 are coupled between nodes 407 and 411. The drain and source terminals of the NMOS transistor 413 are coupled between the node 411 and Vss. The drain and source terminals of the PMOS transistor 415 are coupled between Vdd and node 417. The drain and source terminals of the PMOS transistor 419 are coupled between nodes 417 and 407. The drain and source terminals of the NMOS transistor 421 are coupled between nodes 407 and 423 and the drain and source terminals of the NMOS transistor 425 are coupled between node 423 and Vss.

The drain and source terminals of the PMOS transistor 427 are coupled between Vdd and node 429. The node 429 is provided to the gate terminals of PMOS transistors 431 and 443 and to the gate terminals of NMOS transistors 433 and 445. The drain and source terminals of the PMOS transistor 431 are coupled between Vdd and node 407. The drain and source terminals of the NMOS transistor 433 are coupled between node 407 and Vss. The node 407 is coupled to the gate terminals of a PMOS transistor 435 and an NMOS transistor 437. The drain and source terminals of the PMOS transistor 435 are coupled between Vdd and node 429. The drain and source terminals of the NMOS transistor 437 are coupled between node 429 and Vss. The drain and source terminals of the PMOS transistor 439 are coupled between Vdd and node 441. The drain and source terminals of the PMOS transistor 443 are coupled between nodes 441 and 451. The drain and source terminals of the PMOS transistor 445 are coupled between nodes 451 and 447. The drain and source terminals of the PMOS transistor 449 are coupled between node 447 and Vss.

The gate terminals of a PMOS transistor 453 and an NMOS transistor 455 are coupled to node 457. The drain and source terminals of the PMOS transistor 453 are coupled between Vdd and node 451. The drain and source terminals of the NMOS transistor 455 are coupled between node 451 and Vss. The node 451 is coupled to the gate terminals of a PMOS transistor 459 and an NMOS transistor 461. The drain and source terminals of the PMOS transistor 459 are coupled between Vdd and node 463. The drain and source terminals of the NMOS transistor 461 are coupled between node 463 and Vss.

The node 463 is provided to the gate terminals of a PMOS transistor 467 and an NMOS transistor 469. The drain and source terminals of the PMOS transistor 467 are coupled between Vdd and node 471. The drain and source terminals of the NMOS transistor 469 are coupled between node 471 and Vss. The node 471 is provided to the gate terminals of a PMOS transistor 473 and an NMOS transistor 475. The drain and source terminals of the PMOS transistor 473 are coupled between Vdd and the output node OUT. The drain and source terminals of the NMOS transistor 475 are coupled between the output node OUT and Vss. A test NMOS transistor 465 receives the TL signal at its gate terminal. The drain and source terminals of the NMOS transistor 465 are coupled between node 457 and Vss.

During the high test portion of the IDDQ test as shown in FIG. 4A, the primary inputs CK, IN, SCK and S are asserted high and the THB and TL signals are forced low. The output node OUT goes high in response. In this manner, the gate oxide interfaces of the transistors 409, 421, 427, 433, 435, 439, 445, 449, 455, 459, 469, 473, 479 and 483 receive test voltages. In particular, the gate terminals of the NMOS transistors 409, 421, 433, 445, 449, 455, 469, 479 and 483 are asserted high whereas the corresponding drain and source terminals and respective substrate terminals 410, 422, 434, 446, 450, 456, 470, 480, and 484 are asserted low. In a similar manner, the gate terminals of the PMOS transistors 427, 435, 439, 459 and 473 are asserted low whereas the corresponding drain and source terminals and respective substrate terminals 428, 436, 440, 460 and 474 are asserted high.

During the low test portion of the IDDQ test as shown in FIG. 4B, the primary inputs CK, SCK and S are asserted low whereas the test signals THB and TL are forced high. The output node OUT goes low in response. During this test, the gate oxide interfaces of the remaining transistors 401, 405, 413, 415, 419, 425, 431, 437, 443, 453, 461, 465, 467, 475, 477 and 481 receive a test voltage. In particular, the gate terminals of the PMOS transistors 401, 405, 415, 419, 431, 443, 453, 467, 477 and 481 are asserted low whereas their corresponding drain and source terminals and the respective substrate terminals 402, 406, 416, 420, 432, 444, 454, 468, 478 and 482 receive high voltage levels. Similarly, the gate terminals of the NMOS transistors 413, 425, 437, 461, 465 and 475 are asserted at a high voltage level whereas their corresponding drain and source terminals and respective substrate terminals 414, 426, 438, 462, 466 and 476 receive a low voltage level.

The logic cells described herein, including the AND gate 100, the inverter 200 and the XOR gate 300, illustrate the general principles of the IDDQ test described herein may be applied to any CMOS cell of a standard cell library. In general, each CMOS cell in the library includes one or more inputs, one or more outputs and one or more PMOS and NMOS transistors. Each CMOS cell is configured so that its one or more outputs are high when its one or more inputs are forced high (high test), and so that its outputs are low when its inputs are low (low test). Also, each CMOS cell is configured so that each gate oxide interface of each transistor receives a test voltage during either the high test or the low test of the test mode. Some of the CMOS cells, such as the AND gate 100, meet the IDDQ test criterion described herein and need not be modified. Other CMOS cells are modified by adding at least one test transistor that receives a test signal. Although more than two test transistors may be necessary, only two test signals are necessary for the entire CMOS cell library, where each test transistor receives either one of the first and second test input signals. Each test transistor is configured to be tested in the same manner as the original transistors so that all are tested during the IDDQ test. The same applies for larger cells or "macro" cells incorporating multiple logic cells, or with multiple inputs or multiple outputs. Any logic function or combinations of functions are contemplated, including standard gate types such as AND, NAND, OR, NOR, XOR, XNOR, buffers, etc.

The first and second test inputs, such as the TL and THB signals, collectively indicate any one of a normal mode, a high test mode and a low test mode. Each CMOS cell operates according to its intended function in normal mode. For example, an inverting logic cell, such as the inverter 200, asserts at least one output low when one or more of its inputs are high and vice versa during normal mode. When the first and second test inputs indicate the high test mode, however, the inverting logic cell asserts its outputs high when its inputs are asserted high. Also, when the first and second test inputs indicate the low test mode, the inverting logic cell asserts its outputs low when its inputs are asserted low. The test transistors further ensure that every gate oxide interface of every transistor receives a test voltage during either the high test mode or the low test mode. Any gate oxide interface that does not receive a test voltage during the high test mode receives the test voltage during the low test mode and vice-versa.

As illustrated by the flip flop 400, synchronous type devices or storage elements with clock inputs may also be configured in a similar manner. Any type of input, including clock inputs, set inputs, reset inputs, scan inputs, etc., are treated as primary inputs. Any type of output, including non-inverting and inverting outputs, are treated the same. Test transistors with test inputs are configured in a similar manner. Any type of flip-flop is contemplated, such as JK, D, T, RS, master-slave, triggering, clocked, direct coupled, or the like. Also, any other type of storage element is contemplated, such as latches and registers and the like. In this manner, any CMOS cell library may be configured in accordance with the IDDQ test criterion described herein.

Again, dark shading over a P-N junction denotes that the reverse-biased P-N junction receives a test voltage. In particular, as shown in FIG. 4A, the reversed-biased P-N junctions 485, 486, 487, 488, 489, 490, 491, 492, 493, 494, 495 and 496 of corresponding transistors 405,419, 431, 437, 443, 453, 461, 465, 467, 475, 477 and 481 receive a test voltage during the high test. As shown in FIG. 4B, reversed-biased P-N junctions 497, 498, 499, 404, 408, 412, 418, 424, 430, 442 and 448 of corresponding transistors 409, 421, 433, 435, 445, 455, 459, 469, 473, 479 and 483 receive a test voltage during the low test. Again, not all P-N junctions received the reversed-biased voltage, although it is possible to do so by taking the bulk and well voltages outside of the normal power supply rails as previously described.

Figure 5:
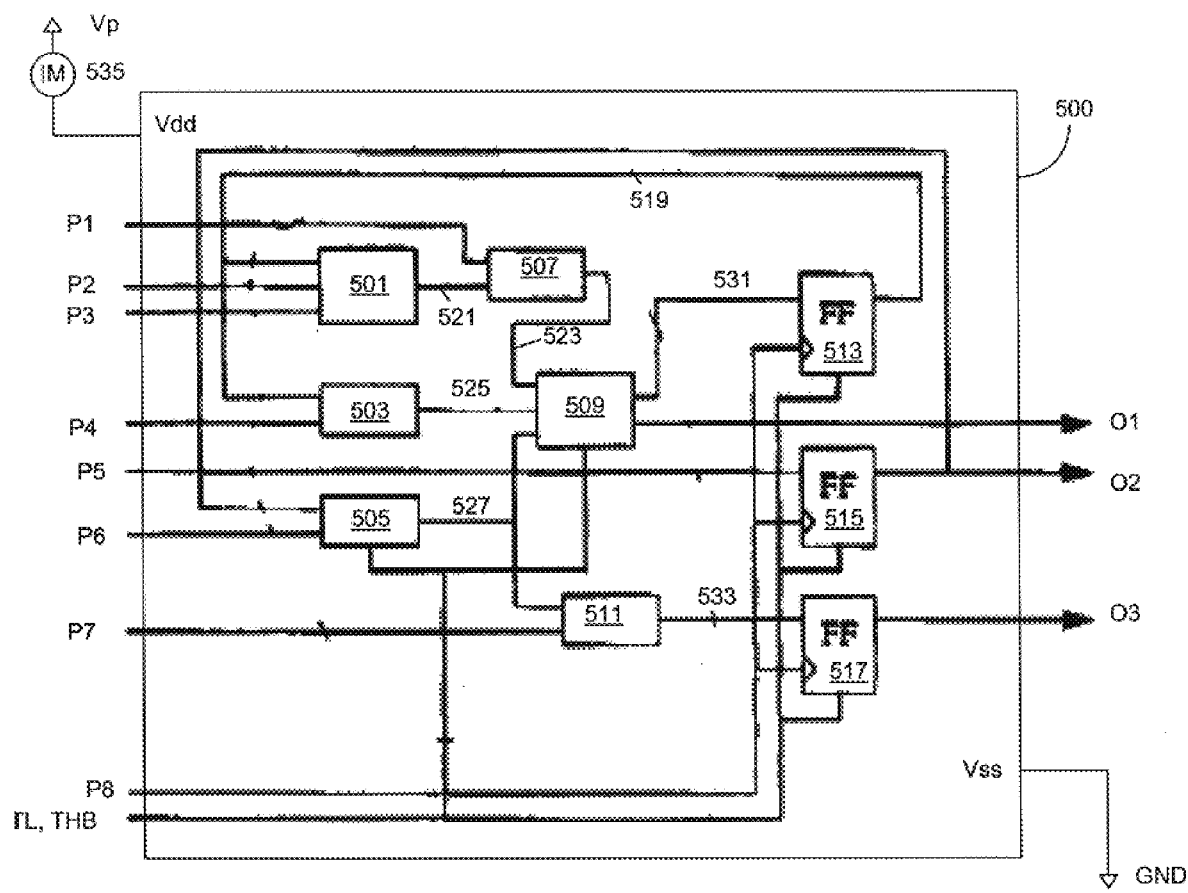
FIG. 5 is a block diagram of a logic block implemented using a test cell library in accordance with the IDDQ test criterion of the present invention.

FIG. 5 is a block diagram of a logic block 500 implemented using a test cell library in accordance with the test procedure of the present invention. The logic block 500 may be implemented in any desired manner, such as a functional block on a monolithic substrate, as a building block for a larger system, as a separate integrated circuit (IC), etc. As shown, the logic block 500 is an example of register-transfer logic (RTL) including combinational logic and storage elements, although it is understood that the principles described herein apply in general to any type of logic circuit.

The logic block 500 includes two power terminals Vdd and Vss as commonly known to those skilled in the art. Vss is coupled to a common or reference voltage terminal, such as ground (GND) as shown. Vdd is coupled to the other voltage terminal, such as a voltage Vp, where the voltage of the power supply between Vp and GND is any standard or non-standard power supply voltage, such as 2.2, 3.3, 5 volts or the like. The logic block 500 includes several primary inputs labeled P1, P2, P3, P4, P5, P6, P7 and P8 (P1–P8). The logic block 500 also has one or more outputs individually labeled O1, O2 and O3. It is understood that additional inputs and outputs may be utilized as desired. The logic block 500 also includes externally-available input test signals TL and THB that operate in a similar manner as previously described.

The logic block 500 includes several logic cells 501, 503, 505, 507, 509, and 511. Also, the logic block 500 includes three flip-flops (FF) 513, 515, and 517, which may be implemented in a similar manner as the flip-flop 400 previously described. The logic cell 501 has three inputs coupled to node 519 and the P2 and P3 inputs, respectively. The logic cell 501 asserts an output on node 521 that is coupled to an input of another logic cell 507. Another input of logic cell 507 receives the P1 input. The logic cell 507 asserts an output on node 523 that is coupled to an input of the logic cell 509. The logic cell 509 has two additional inputs coupled to nodes 525 and 527. The logic cell 509 asserts an output on node 531 and the O1 output. The logic cell 503 has an input coupled to node 519 and another input coupled to the P4 input. The logic cell 503 asserts its output on node 525. The logic cell 505 has inputs coupled to the O2 output and the P6 input. The logic cell 505 asserts its output on node 527. The logic cell 511 has inputs coupled to nodes 527 and the P7 input and asserts its output on node 533. The logic cells 505 and 509 receive the test signals TL and THB.

The flip-flops 513–517 each have their clock inputs coupled to the P8 input. The flip-flops 513–517 each receive the TL and THB test signals. The flip-flop 513 has its input coupled to node 531 and asserts its output on node 519. The flip-flop 515 receives the P5 input at its input and asserts its output as the O2 output. The flip-flop 517 has its input coupled to node 533 and asserts the O3 output at its output.

It is appreciated that each of the logic cells 501–511 and the flip-flops 513–517 are implemented in accordance with the cell library previously described. Some of the logic cells, such as logic cells 501, 503 and 507 may 10 not need the test input signals TL and THB since they may otherwise meet the test criteria previously described. The logic cells 505 and 509 and the flip-flops 513–517 operate normally when the TL signal is negated low and the THB signal is negated high. The logic cells 505 and 509 and the flip-flops 513–517, however, operate according to the high test when the THB signal is asserted 15 low (while the TL signal is negated low) and according to the low test when the TL signal is asserted high (while the THB signal is negated high).

For purposes of IDDQ testing, the logic block 500 is inserted into a testing device (not shown) that provides power via Vp and GND signals to the Vdd and Vss terminals of the logic block 500. A current detect circuit (IM) 535 is inserted between the Vp signal and the Vdd terminal to measure or otherwise sample the static or quiescent drain current or IDDQ during the IDDQ test. The current detect circuit 535 does not drop a significant voltage to influence the test.

During the high test, the P1–P8 inputs are asserted high and the TL and THB signals are low, so that each of the inputs of the logic cells 501–511 and the inputs of the flip-flops 513–517 are asserted high. During the low test, the P1–P8 inputs are asserted low and the TL and THB signals are high, so that each of the inputs of the logic cells 501–511 and the inputs of the flip-flops 513–517 are asserted low. It is observed that the P1–P8 inputs are not coupled to each of the inputs of each of the logic blocks 501–511 and the flip-flops 513–517. In particular, some inputs are internally coupled to the outputs of other logic cells and not provided externally. For example, node 525 is provided as an input to logic cell 509 and not externally available. Since each of the logic cells 501–511 and the flip-flops 513–517 are implemented for the IDDQ test, then the high state propagates through every cell to the outputs during the high test and the low state propagates through every cell to the outputs during the low test. For example, since the P5 input is asserted high (low) during the high (low) test, the flip-flop 515 asserts its output high (low) in response, so that the O2 output is asserted high (low). Since the O2 output and the P6 input are asserted high (low) during the high (low) test, the logic cell 505 asserts node 527 high (low), which propagates to the logic cells 509 and 511. Operation is similar for each logic cell and each node, so that the conditions of the IDDQ test are met.

During the high (low) test, the IDDQ current is measured, such as by the current detect circuit 535. If the IDDQ current remains below a predetermined threshold current level for both the high and low tests, then the device under test passes. Otherwise, the device fails. For most CMOS circuitry, the drain current (Idd) for each transistor should be very small. Also, even though the drain current accumulates and is the summation through all transistors of the device under test, the total drain current should still be very small. This condition is true even for very large circuits, such as Very Large Scale Integration (VLSI) devices and the like with millions of transistors or more. If any gate oxide interface of any transistor has failed, such that the interface is effectively a low resistance, then the current through that transistor is relatively high when voltage is applied. Since the drain current accumulates, the measured IDDQ current should be relatively high for the entire device under test, such as an order of magnitude or the like greater than the normal drain current for the device. The expected drain current range for any device known to be operating correctly may be measured for purposes of determining an appropriate threshold current level. In one embodiment, for example, the threshold current level is selected as at least an order of magnitude greater than the normal drain current. In any event, for any particular device to be tested, a predetermined threshold current level is used to determine whether the device passes or fails the IDDQ test.

Figure 6:
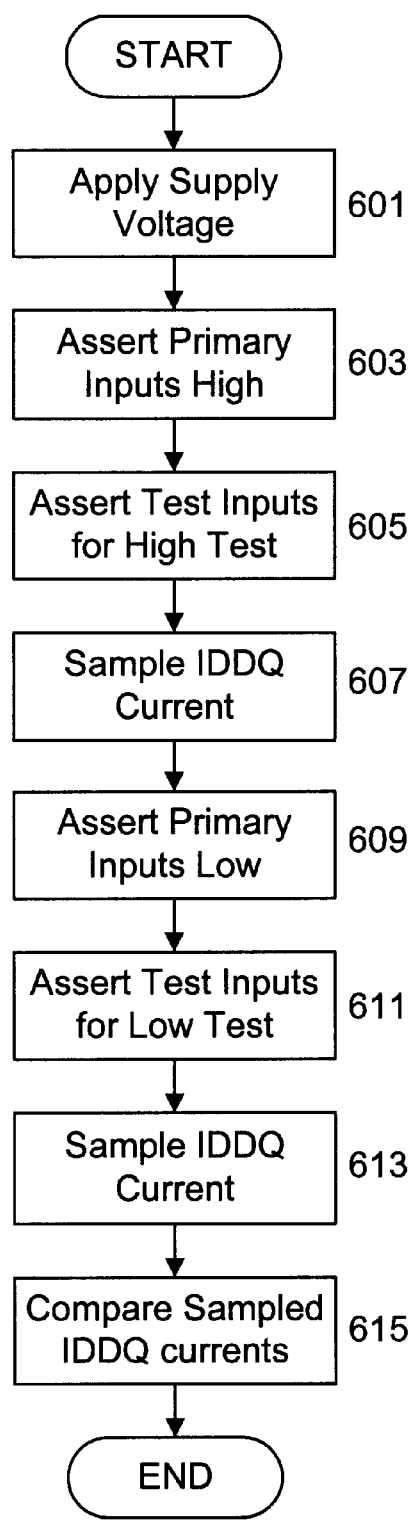
FIG. 6 is a flow chart diagram illustrating the IDDQ test procedure to measure IDDQ current for any CMOS device implemented using the IDDQ cell library described herein, including the logic block of FIG. 5.

FIG. 6 is a flow chart diagram illustrating the IDDQ test procedure to measure IDDQ current for any CMOS device implemented using the IDDQ cell library described herein, including the logic block 500. It is noted that in the flow chart of FIG. 6 and subsequent flow charts (FIGS. 9, 11, 13, 15), the particular ordering of the blocks is exemplary only and may be re-arranged in any manner as long as the primary test objectives are achieved. Furthermore, as appreciated by those of ordinary skill in the art, any standard CMOS test criterion may be followed to ensure valid testing and to maintain integrity of the device under test. For example, the inputs would not be left floating but would otherwise be pulled high or low when power supply voltage is applied to damage to the CMOS circuitry. Many other specific test details are not specifically described herein as they are known to those of ordinary skill in the art and are not necessary for a full understanding of the principals of the invention described herein.

At first block 601, operating voltage is applied via the Vdd and Vss power input signals. At next block 603, all of the primary inputs are asserted high and at next block 605 the test inputs are forced to the appropriate level for the high test. For example, for the logic block 500 the primary inputs P1–P8 are asserted high, whereas the TL and THB signals are forced low. At next block 607, the IDDQ current is sampled such as by the current detect circuit 535. At next block 609, all of the primary inputs are asserted low and at next block 611, the test inputs are forced to the appropriate level for the low test. For the logic block 500, the primary inputs P1–P8 are asserted low, whereas the TL and THB signals are forced high for the low test. At next block 613, the IDDQ current is sampled, such as by the current detect circuit 535. The sampled current IDDQ for the high and low tests are compared against the predetermined threshold current level at next block 615 to complete the test. If the IDDQ current is greater than the threshold current, then the device under test fails. Otherwise, the device passes the IDDQ test.

The logic block 500 illustrates that any CMOS circuit may be designed in accordance with the present invention to test each gate oxide interface of each transistor of the circuit with only two test vectors. The first test vector is applied at the primary inputs during the high test and the second test vector is applied at the primary inputs during the low test. It is further noted that the test vectors may be simplified, in that the primary inputs comprise all logic ones (high) or all logic zeros (low). The test input signal logic may also be modified in an alternative embodiment so that the entire test vectors may be high for the high test and low for the low test. If the CMOS library described above is utilized to design the CMOS circuit, then the conditions for the IDDQ test described herein are automatically met. The primary inputs of the CMOS circuit comprise a subset of all of the inputs of all of the CMOS cells utilized in the circuit. The CMOS cells may include one or more logic gates and/or one or more storage elements retrieved from the CMOS library.

In general, however, any CMOS circuit may be implemented with a plurality of PMOS and NMOS transistors that are coupled together to form a logic circuit intended to perform a corresponding logic function in a normal mode. The CMOS circuit includes one or more primary inputs and the first and second test inputs, where the test inputs indicate a normal mode, a high test mode and a low test mode. Also, one or more test transistors are included so that each gate oxide interface of each transistor of the logic circuit receives a test voltage during either the high test mode when each primary input is asserted high or during the low test mode when each primary input is asserted low.

It is appreciated that several benefits are achieved utilizing a CMOS cell library as described herein. The IDDQ test may be conducted with only two test vectors, one for the high test and the other for the low test during the test mode. The test vectors may be simplified if desired, such as comprising all logic ones or zeros. The IDDQ test, therefore may be completed in a very short amount of time as compared to traditional IDDQ test methodologies. Such traditional test methodologies required a multitude of test vectors to be applied at the primary inputs, consuming valuable time. Also, even with thousands of such test vectors, there was no assurance that every gate oxide interface would be tested. In fact, most traditional test methodologies were directed to test as many gate oxide interfaces as possible, but invariable less than all such interfaces of the CMOS circuit. The IDDQ test methodology described herein ensures that 100% of the gate oxide interfaces are tested during the IDDQ test. Many P-N junctions are also tested with a reversed-biased test voltage.

Figure 7:
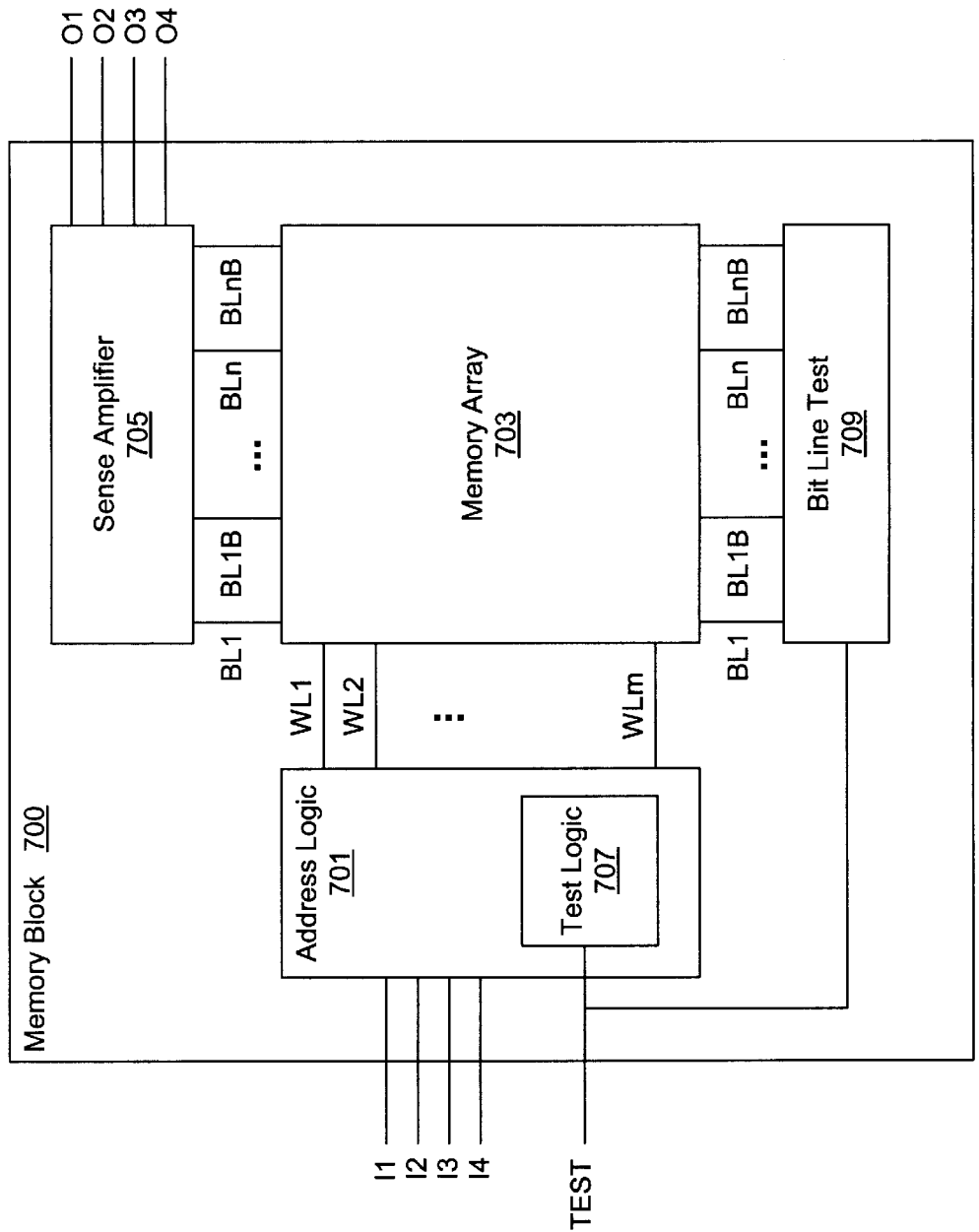
FIG. 7 is a simplified block diagram of an exemplary memory block that may be used with any one of several types of memory arrays for conducting an IDDQ test in accordance with the present invention for memory devices.

FIG. 7 is a simplified block diagram of a memory block 700 that may be used with any one of several types of memory arrays for conducting an IDDQ test in accordance with the pre sent invention for memory devices. The memory block 700 may be implemented as a separate logic block, on a monolithic substrate, as a logic block of a larger system, on a separate IC, etc. The memory block 700 includes primary supply voltage inputs Vdd and Vss coupled to a power source Vp and GND as previously described. The current detect circuit 535 is coupled between Vp and Vdd to measure the IDDQ current during test.

The memory block 700 generally includes the primary portions of a memory system, including address logic 701, such as an address decoder or the like, a memory array 703 and a sense amplifier 705. In general, one or more inputs I1–I4 of the memory block 700 are provided to the address logic 701. A plurality of outputs, such as output signals O1–O4 are shown asserted by the sense amplifier 705. The address logic 701 asserts a plurality "m" of word line "WL" signals individually denoted WL1, WL2, . . . WLm to the memory array 703. The memory array 703 is coupled to a plurality of bit line (BL) signals depending upon the type of array. In one embodiment, the bit line signals comprise "non-inverted" and "inverted" bit line signal pairs. The terms "non-inverted" and "inverted" are relational only with respect to each other and each bit line signal may conform to positive or negative logic as desired. The memory array 703 includes a plurality "n" of bit line pairs individually labeled BL1 and BL1B, BL2 and BL2B, . . . BLn, BLnB to the sense amplifier 705. In other embodiments, only the non-inverted bit line signals BL1–BLn are utilized. The sense amplifier 705 detects the bit line signals and asserts the output signals O1–O4 in a similar manner as known to those skilled in the art.

Several portions of the memory block 700 are modified in order to test the memory array 703 in accordance with an IDDQ test for memories. In particular, one or more test signals, collectively denoted "TEST", are provided to test logic 707 within the address logic 701. Although the test logic 707 is conveniently located within the address logic 701 as shown, the test logic 707 may be configured externally for controlling the address logic 701 during the test mode. The test logic 707 is configured to assert the word line signals WL1–WLm in accordance with the IDDQ test being performed for the particular type of memory array. Further, a bit line test module 709 is provided that receives the TEST signals and that forces the bit line signals depending upon the particular IDDQ test being conducted. In general, the bit line test module 709 comprises bit line test logic that receives the TEST signals and that simultaneously asserts the bit line signals during the test mode. As described further below, the bit line test module 709 simultaneously asserts the non-inverted bit lines BLn or the inverted bit lines BLnB or both as necessary for the particular type of memory array. It is appreciated that the memory block 700 is shown in generalized form and that minor modifications may be made depending upon the type of memory array 703. Several types of memory arrays are considered herein, including a static random access memory (SRAM), a read-only memory (ROM), an erasable programmable ROM (EPROM) and a dynamic RAM (DRAM), although other types of memory devices are contemplated. For the memory devices, the IDDQ test does not necessarily include high test and low test portions as described above for the combinatorial logic or the flip-flop storage elements or the like. Depending upon the type of memory array, the IDDQ test may include one or two separate test portions for testing the array.

Figures 8A, 8B:
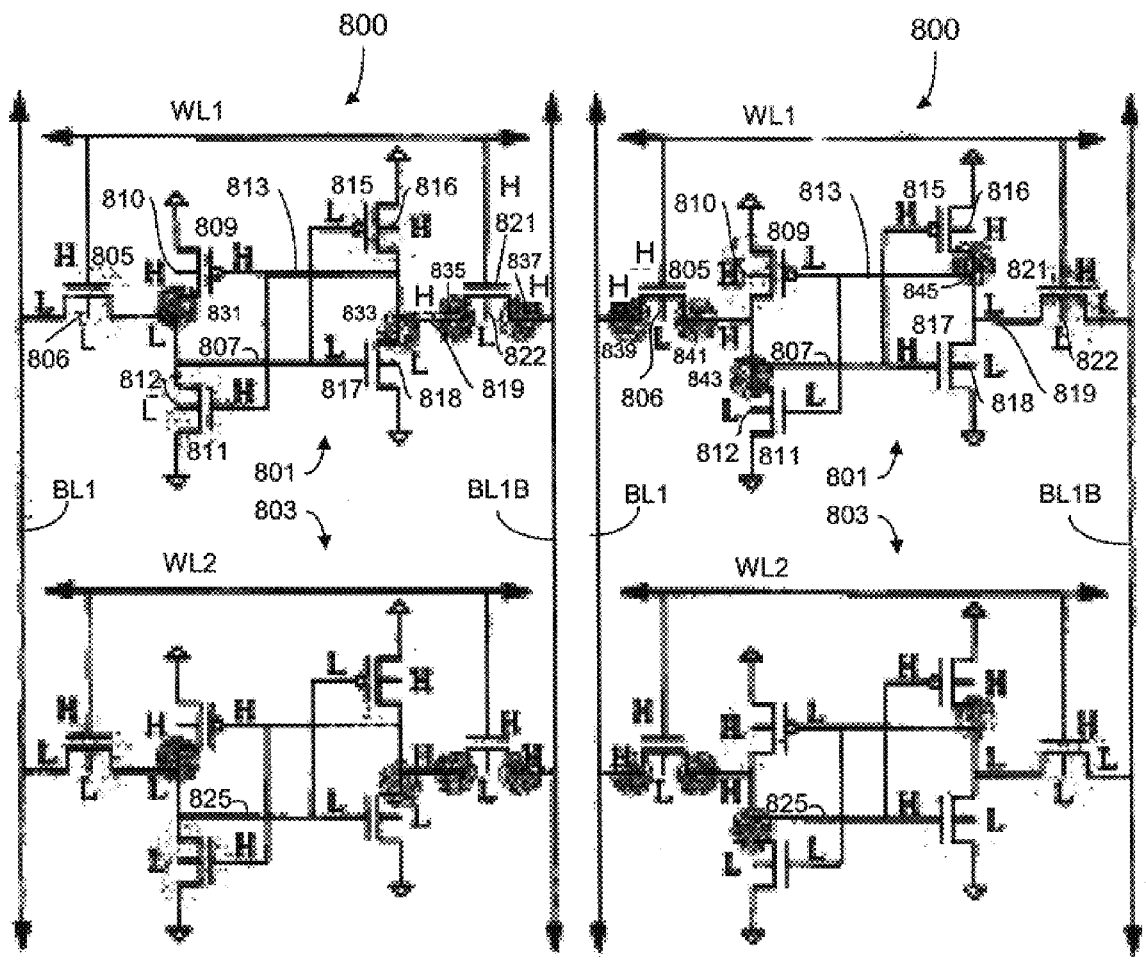
FIGS. 8A and 8B are schematic diagrams of a portion of an exemplary static random access memory (SRAM) during an IDDQ test.

FIGS. 8A and 8B are schematic diagrams of a portion of an exemplary SRAM 800 during an IDDQ test. As shown in FIGS. 8A and 8B, two memory cells 801 and 803 of the SRAM 800 are shown, where it is understood that any number of memory cells is contemplated. The first memory cell 801 is coupled between complementary bit line pairs BL1 and BL1B and coupled to a word line WL1. In particular, a n NMOS transistor 805 has its drain and source coupled between bit line BL1 and node 807. A PMOS transistor 809 has its drain and source terminals coupled between Vdd and node 807. An NMOS transistor 811 has its drain and source terminals coupled between node 807 and Vss. The node 807 is provided to the gate terminals of a PMOS transistor 815 and an NMOS transistor 817. The PMOS transistor 815 is coupled between Vdd and node 813. The NMOS transistor 817 has its drain and source terminals coupled between node 813 and Vss. The node 813 is provided to the gate terminals of the PMOS transistor 809 and the NMOS transistor 811. An NMOS transistor 821 has its drain and source terminals coupled between node 819 and bit line BL1B. The memory cell 803 is configured in substantially the same manner as memory cell 801 and is not further described, except that memory cell 803 includes node 825 that corresponds to node 807 of the memory cell 801. FIG. 8A illustrates the SRAM 800 during a first test portion and FIG. 8B illustrates the SRAM 800 during a second test portion of the IDDQ test.

Figure 9:
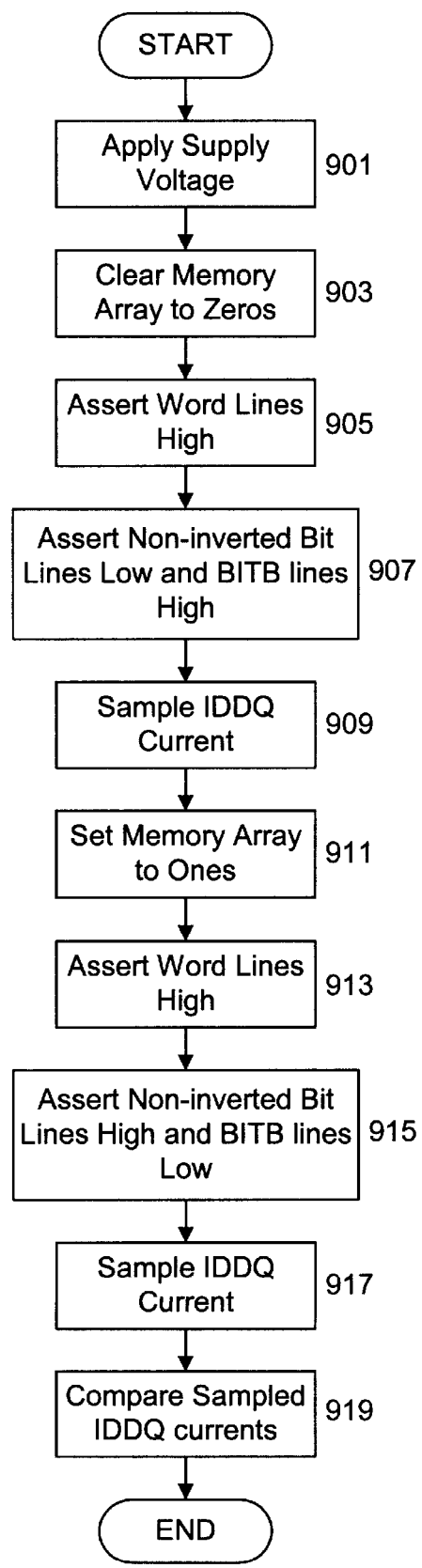
FIG. 9 is a flow chart diagram illustrating operation of an IDDQ test procedure for testing the SRAM of FIGS. 8A and 8B, which may be configured as the memory array of the memory block of FIG. 7.

FIG. 9 is a flow chart diagram illustrating operation of an IDDQ test procedure for testing the SRAM 800, which may be configured as the memory array 703 of the memory block 700 utilizing the current test device 535 to measure IDDQ current. At first block 901, supply voltage is applied across Vdd and Vss. To initiate the first portion of the IDDQ test, the memory array 703 comprising the SRAM 800 is pre-programmed low, or otherwise cleared to logic zeros in each memory cell. This is illustrated in FIG. 8A by node 807 of memory cell 801 and corresponding node 825 of memory cell 803 having a logic low level. In this manner, all memory cells in the SRAM 800 of the memory array 703 are loaded with logic zeros. At next block 905, the word lines WL1–WLm of the memory block 703 are asserted high. As shown in FIG. 8A, the word lines WL1 and WL2 are asserted high for purposes of illustration. At next block 907, the non-inverted bit lines BL1–BLn are asserted low by the bit line test module 709 as illustrated by BL1 of the SRAM 800 being asserted low. Also, the inverted bit lines BL1B–BLnB of the memory array 703 are asserted high by the bit line test module 709. This is illustrated in FIG. 8A as BL1B being asserted high. It is noted that assertion of the bit lines may be optional since the bit lines would likely be forced by adjacent bits. The bit line test module 709 is provided to ensure proper assertion of the bit lines. At next block 909, the IDDQ current through memory array 703 is sampled by the current detect device 535.

At next block 911, the memory array 703 is pre-programmed high to logic ones to initiate the second portion of the IDDQ test as illustrated in FIG. 8B. Thus, the node 807 of memory cell 801 and the corresponding node 825 of memory cell 803 are programmed to logic high. At next block 913, the word lines WL1–WLm of the memory array 703 are asserted high, illustrated in FIG. 8B as the word lines WL1 and WL2 being asserted high. At next block 915, the non-inverted bit lines BL1–BLn are asserted high as illustrated by bit line BL1 being asserted high in FIG. 8B. Also, the inverted bit lines BL1B–BLnB are asserted low by bit line test module 709 as illustrated by the bit line BL1B being asserted low in FIG. 8B. Again, assertion of the bit lines may be optional. At next block 917, the IDDQ current of the memory array 703 is sampled by current detect circuit 535. At next block 919, the sampled IDDQ currents of the memory array 703 during the first and second test portions are compared with a predetermined threshold current to determine whether the memory array 703 passes or fails the IDDQ current test.

During the first portion of the test when the word lines are asserted high and the non-inverted bit lines are asserted low as shown in FIG. 8A, the gate oxide interfaces of the transistors 805, 811, and 815 receive a test voltage. In particular, the NMOS transistors 805 and 811 receive a high voltage at their gate terminals and a low voltage at their drain and source terminals and their respective substrate terminals 806, 812. Also, the PMOS transistor 815 receives a low voltage at its gate terminal and a high voltage at its drain and source terminals and at its substrate terminal 816. The corresponding transistors in memory cell 803 are tested in a similar manner. During the second test portion of the IDDQ test, the remaining transistors 809, 817 and 821 receive test voltages. In particular, the PMOS transistor 809 receives a low voltage at its gate terminal and high voltages at its drain and source terminals and at its substrate terminal 810. Similarly, the NMOS transistors 817 and 821 receive a high voltage at their gate terminals and low voltages at their drain and source terminals and their respective substrate terminals 818 and 822. Again, the corresponding transistors in the memory cell 803 are similarly tested. It is appreciated, therefore, that all of the gate oxide interfaces of all transistors of the entire SRAM 800 receive test voltages during the IDDQ test.

Again, dark shading over a P-N junction denotes that the reverse-biased P-N junction receives a test voltage. In particular, as shown in FIG. 8A, the reversed-biased P-N junctions 831, 833, 835 and 837 of corresponding transistors 809, 817 and 821 of the memory cell 801, and corresponding P-N junctions of memory cell 803, receive a test voltage during the first test portion. As shown in FIG. 8B, reversed-biased P-N junctions 839, 841, 843 and 845 of corresponding transistors 805, 811 and 815 of the memory cell 801, and corresponding P-N junctions of memory cell 803, receive a test voltage during the second test portion. Again, not all P-N junctions received the reversed-biased voltage, although it is possible to do so by taking the bulk and well voltages outside of the normal power supply rails as previously described.

Figure 10A:
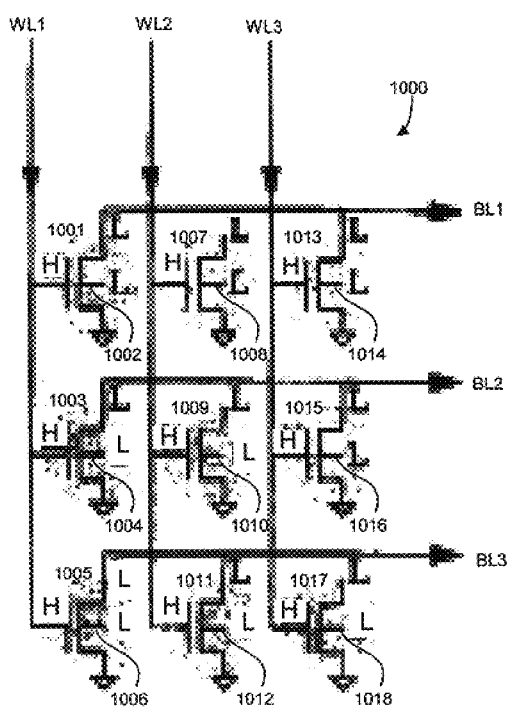
FIGS. 10A and 10B are schematic diagrams of a portion of an exemplary ROM during an IDDQ test.
Figure 10B:
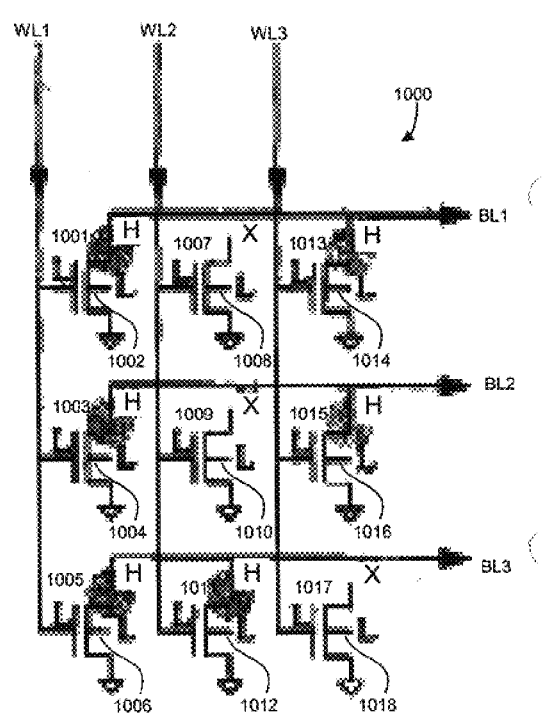

FIGS. 10A and 10B are schematic diagrams of a portion of an exemplary ROM 1000 during an IDDQ test. FIG. 10A illustrates the ROM 1000 during a first test portion of the IDDQ test, and FIG. 10B illustrates the ROM 100 during a second test portion for testing one or more P-N junctions with a reversed-biased voltage. Due to the particular configuration of the ROM 1000, the gate oxide interfaces of each of the transistors receives a test voltage during the first test portion so that a second test portion is not necessary. As shown, word line WL1 is provided to the gate terminals of NMOS transistors 1001, 1003 and 1005. The word line WL2 is provided to the gate terminals of NMOS transistors 1007, 1009, and 1011. The word line WL3 is provided to the gate terminals of 1013, 1015, and 1017.

The drain and source terminals of each of the NMOS transistors 1001, 1007, and 1013 are initially coupled between bit line BL1 and Vss. The NMOS transistor 1007, however, is "programmed" and thus is disconnected from the bit line BL1. The drain and source terminals of each of the NMOS transistors 1003, 1009 and 1015 are initially coupled between bit line BL2 and Vss. The NMOS transistor 1009, however, is programmed and thus is disconnected from the bit line BL2. The drain and source terminals of each of the NMOS transistors 1005, 1011, and 1017 are coupled between bit line BL3 and Vss. The NMOS transistor 1017, however, is programmed and thus is disconnected from the bit line BL3. Of course, additional transistors may be included for a larger array.

Figure 11:
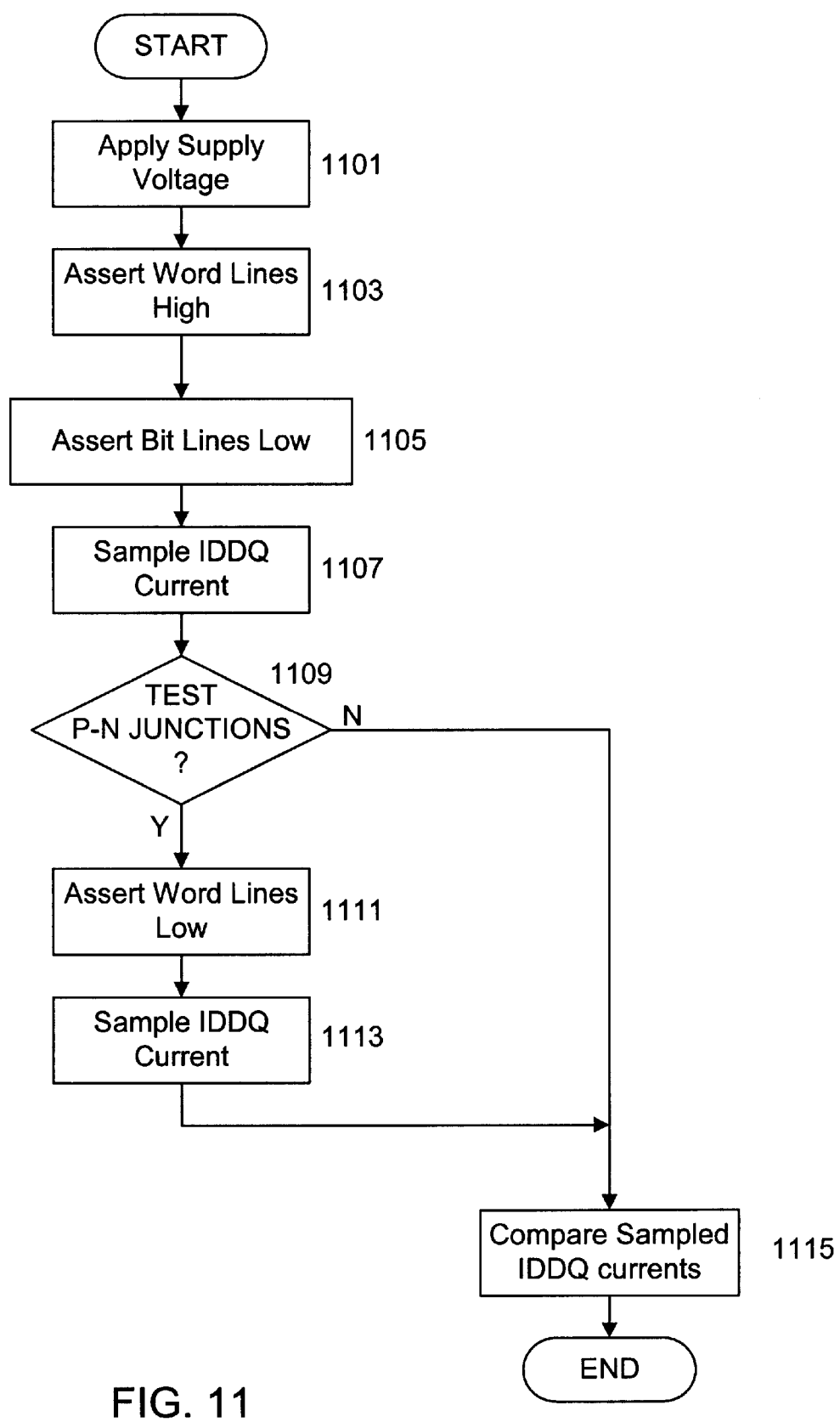
FIG. 11 is a flow chart diagram illustrating an IDDQ test procedure for testing the ROM of FIG. 10, which may be configured as the memory array of the memory block of FIG. 7.

FIG. 11 is a flow chart diagram illustrating an IDDQ test procedure for testing the ROM 1000. The ROM 1000 may be configured as the memory array 703 of the memory block 700. At first block 1101, supply voltage is applied to the memory block 700 across the voltage terminals Vdd and Vss. At next block 1103, the word lines WL1–WLn are asserted high and at next block 1105, the bit lines BL1–BLn are asserted low as shown in FIG. 10A. This may be considered an optional step since in a ROM it is almost certain that at least one other word in the array will already force the bit lines BL1–BLn low. The bit line test module 709 is provided to ensure that the bit lines BL1–BLn are asserted low. At next block 1107, the IDDQ current is tested by the current detect circuit 535. If the P-N junctions are not to be tested as determined at query block 1109, then operation proceeds to block 1115 in which the IDDQ current is compared with a predetermined threshold current. It is noted that all of the transistors 1001–1017 have been tested during the first test portion since each gate oxide interface has received a test voltage. In particular, the gate terminals of all the transistors 1001–1017 are asserted high whereas the drain and source terminals and the respective substrate terminals 1002, 1004, 1006, 1008, 1010, 1012, 1014, 1016, 1018 receive a low voltage level.

If it is further desired to test the P-N junctions of the transistors of the ROM 1000 with a reversed-biased voltage, operation proceeds to step 1111 in which the word lines WL1–WLn are asserted low as illustrated in FIG. 10B. P-N junctions are shown with dark shading. When all the word lines are pulled low, the bit lines BL1–BLn are pulled high by pre-charge. When the word lines are pulled low, the P-N junctions coupled to the bit lines receive a reversed biased voltage. The P-N junctions for the programmed transistors 1007, 1009 and 1017 are not tested. The IDDQ current is then sampled at next block 1113 and the IDDQ currents are compared at next block 1115 as previously described.

FIGS. 12A and 12B are schematic diagrams of a portion of an exemplary EPROM 1200 during an IDDQ test. The EPROM 1200A includes a plurality of floating gate NMOS transistors 1201, 1203, 1205, 1207, 1209, 1211, 1213, 1215, 1217 (1201–1217) configured in a similar manner as the ROM 1000, except that programming is performed in a different manner. In particular, the word line WL1 is coupled to the gate terminals of NMOS transistors 1201–1205, word line WL2 is coupled to the gate terminals of NMOS transistors 1207–1211, and word line WL3 is coupled to the gate terminals of NMOS 1213–1217. The drain and source terminals of NMOS transistors 1201, 1207 and 1213 are coupled between bit line BL1 and Vss, the drain and source terminals of NMOS transistors 1203, 1209, and 1215 are coupled between bit line BL2 and Vss, and the drain and source terminals of NMOS transistors 1205, 1211, and 1217 are coupled between bit line BL3 and Vss.

FIG. 12A is the EPROM 1200 with the word lines WL1–WLn asserted high and the bit lines BL1–BLn asserted low for the first portion of the IDDQ test. In a similar manner as the ROM 1000, the gate oxide interfaces of each transistor 1201–1217 are tested during the first test portion and a corresponding second test portion is unnecessary for this purpose. FIG. 12B is the EPROM 1200 with the word lines WL1–WLn asserted low and the bit lines BL1–BLn asserted high for testing the P-N junctions coupled to the bit lines BL1–BLn with a reversed-biased voltage voltage.

Figure 13:
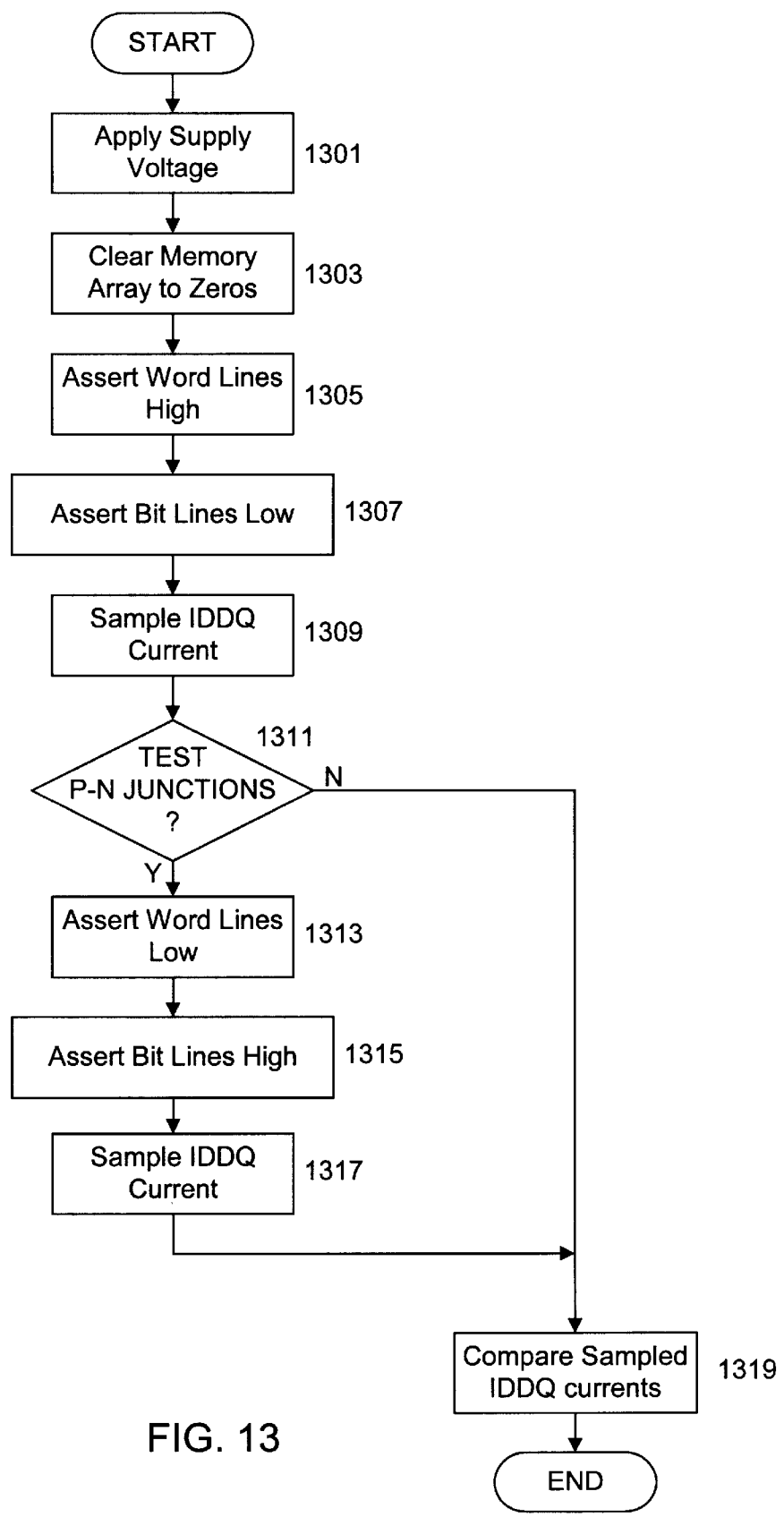
FIG. 13 is a flow chart diagram illustrating operation of the IDDQ test as applied to the memory array of FIG. 7 configured with the EPROM of FIGS. 12A and 12B.

FIG. 13 is a flow chart diagram illustrating operation of the IDDQ test as applied to the memory array 703 configured with the EPROM 1200. At first block 1301, supply voltage is applied to the Vdd and Vss terminals. At next block 1303, the memory array 703 comprising the EPROM 1200 is pre-programmed low or otherwise cleared to logic zeros. At next block 1305, the word lines WL1–WLm are asserted high and at next block 1307, the bit lines BL1–BLn are asserted low by the bit line test module 709 as shown in FIG. 12A. Forcing the bit lines BL1–BLn low may be considered an optional step since otherwise the bit lines will almost certainly be pulled low through another word. At next block 1309, the IDDQ current is sampled via current detect circuit 535. If the P-N junctions coupled to the bit lines are not to be tested as determined at query block 1311, then operation proceeds to block 1319 in which the IDDQ current is compared with a predetermined threshold current, completing the first test portion. If it is desired to test the P-N junctions, operation proceeds instead from block 1311 to block 1313 in which the word lines WL1–WLm are asserted low as shown in FIG. 12B for a second test portion. At next block 1315, the bit lines BL1–BLn are asserted high. At next block 1317 the IDDQ current is sampled by current detect circuit 535. Operation then proceeds to block 1319 to compare the IDDQ currents to complete the first and second portions of the IDDQ test.

It is appreciated that all of the gate oxide interfaces of the NMOS transistors 1201–1217 receive a test voltage during the first test portion as shown in FIG. 12A. In particular, the gate terminals of each transistor 1201–1217 receives a high voltage level and the drain and source terminals and the respective substrate terminals 1202, 1204, 1206, 1208, 1210, 1212, 1214, 1216 and 1218 receive a low voltage level. In this manner, every gate oxide junction of every transistor within the entire EPROM 1200 is tested with a single test vector. Only two test vectors are necessary to further test the P-N junctions coupled to the bit lines.

Figure 14A:
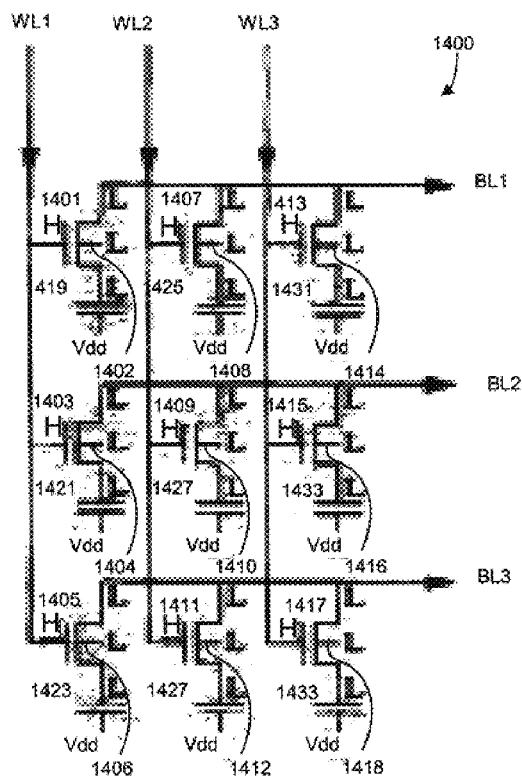
FIGS. 14A and 14B are schematic diagrams of a portion of exemplary DRAMs during IDDQ testing.
Figure 14B:
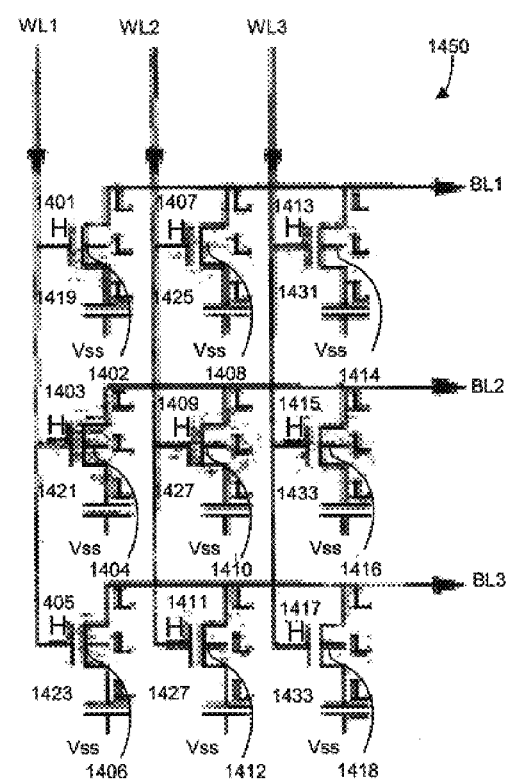

FIGS. 14A and 14B are schematic diagrams of a portion of exemplary DRAMs 1400 and 1450 during an IDDQ test. A plurality of NMOS transistors 1401, 1403, 1405, 1407, 1409, 1411, 1413, 1415, 1417 (1401–1417) are included in the array although it is understood that additional transistors may be included for a larger array. Corresponding storage capacitors 1419, 1421, 1423, 1425, 1427, 1429, 1431, 1433, and 1435 (1419–1435) are each coupled to a respective one of the transistors 1401–1417. The DRAM 1400 of FIG. 14A has its capacitors 1419–1435 coupled high such as to the Vdd node. The DRAM 1450 of FIG. 14B is similar to the DRAM 1400 except that the capacitors 1419–1435 are coupled low, such as to the Vss node. For both DRAMs 1400, 1450, word line WL1 is coupled to the gate terminal of NMOS transistors 1401–1405, word line WL2 is coupled to the gate terminal of NMOS transistors 1407–1411 and word line WL3 is coupled to the gate terminal of NMOS transistors 1413–1417. The drain and source terminals of the NMOS transistors 1401, 1407, and 1413 are coupled between bit line BL1 and to one side of storage capacitors 1419, 1425, and 1431, respectively. The drain and source terminals of NMOS transistors 1403, 1409, and 1415 are coupled between bit line BL2 and to one side of storage capacitors 1421, 1427, and 1433, respectively. The drain and source terminals of the NMOS transistors 1405, 1411, and 1417 are coupled between bit line BL3 and to one side of storage capacitors 1423, 1429, and 1435 respectively.

Figure 15:
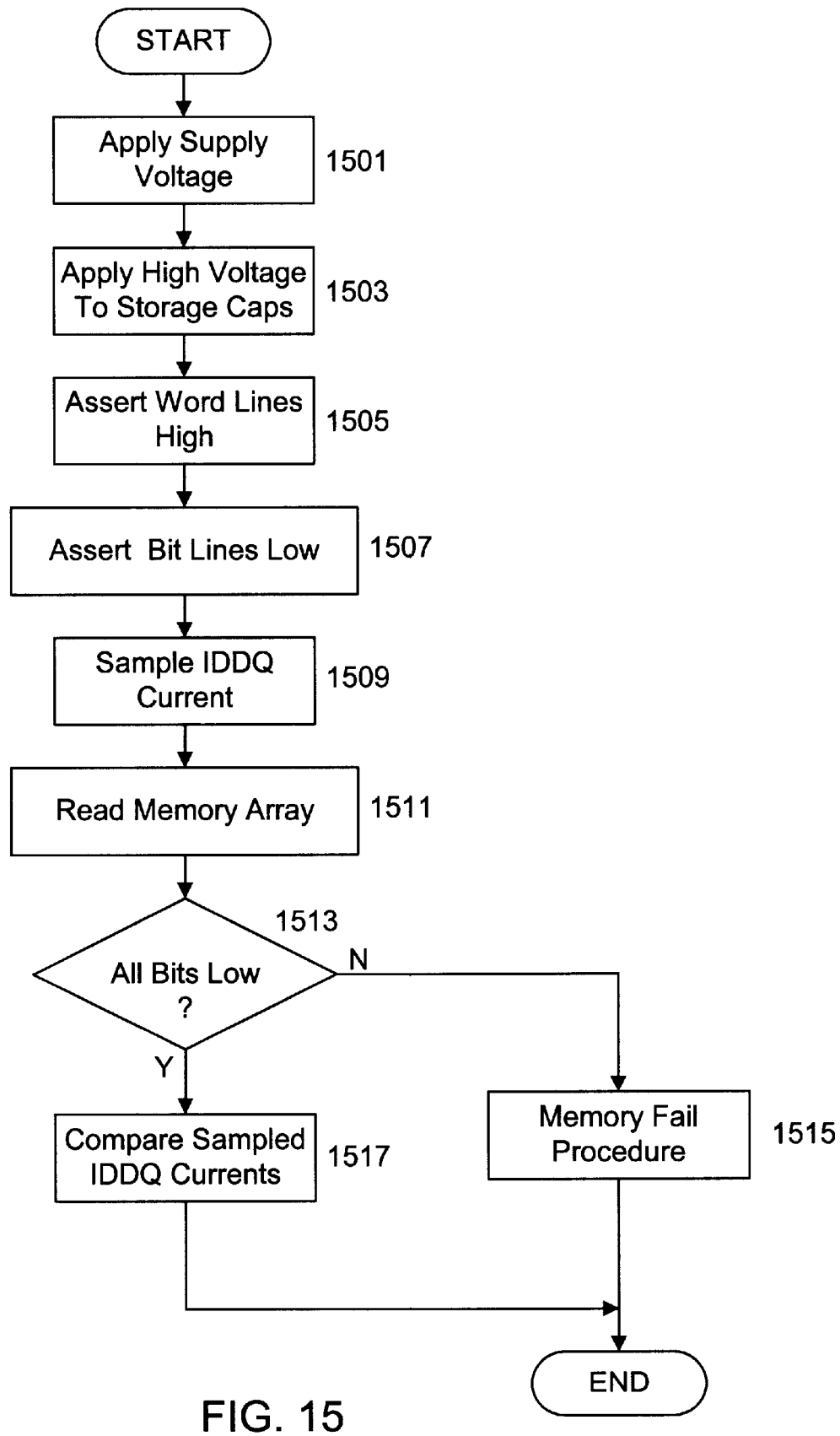
FIG. 15 is a flow chart diagram illustrating a test procedure for the DRAM of FIGS. 14A and 14B configured as the memory array of the memory block of FIG. 7.

FIG. 15 is a flow chart diagram illustrating a test procedure for the DRAM 1400 configured as the memory array 703 of the memory block 700. At first block 1501, supply voltage is applied and at next block 1503, the DRAM 1400 is pre-programmed high for the test mode. In particular, all of the storage capacitors 1419–1435 are set to a high voltage to program the entire DRAM 1400 with high values. At next block 1505, the word lines WL1–WLm are asserted high and at next block 1507 the bit lines BL1–BLn are asserted low. When the bit lines are asserted low, all of the storage cells will correspondingly be programmed low. At next block 1509, the IDDQ current is sampled by the current detect circuit 535. At next block 1511, the memory array 703 with the DRAM 1400 is read. It is noted that all of the bit locations should have been pulled low if the DRAM 1400 is operating properly. At next block 1513, it is queried whether all of the bit locations of the DRAM 1400 have been asserted low. If not, operation proceeds to 1515 for a fail procedure indicating that the DRAM 1400 has failed the test in that at least one of the memory cells failed. Otherwise, operation proceeds to block 1517 where the IDDQ current is compared with a predetermined threshold current to determine if the DRAM 1400 passes or fails and operation is complete.

The DRAM 1450 of FIG. 14B is similar to the DRAM 1400 of FIG. 14A except that the capacitive memory cells are coupled to a low voltage, such as to Vss. In this case, the DRAM 1450 is stressed in a similar manner as the DRAM 1400 during the IDDQ test, except that cell capacitance is not tested. Capacitance of the DRAM 1450 may be tested with an additional write then read of a high value into each bit location of the DRAM 1450.

Each of the gate oxide interfaces of each of the transistors 1401–1417 of the DRAM 1400 or 1450 receives a test voltage during a first portion of the IDDQ test. As shown in FIGS. 14A and 14B, all of the gate terminals of the NMOS transistors 1401–1417 receive a high logic voltage level whereas the drain and source terminals and the respective substrate terminals 1402, 1404, 1406, 1408, 1410, 1412, 1414, 1416, and 1418 receive a logic low voltage level. If any of these gate oxide interfaces of the entire DRAM is malfunctioning, then the IDDQ test fails. It is noted that, depending on the size and timing of the DRAM, it may not be possible to test the entire array at once since programmed capacitors may leak significantly before the test is completed. If timing or refresh are issues, the DRAM array may be tested in the same manner with multiple passes, each pass testing a portion of the array until the entire array is tested.

It is appreciated that any functional module block or integrated circuit may be implemented according to the present invention and tested with up to two test vectors as described herein. A CMOS cell library is configured with a plurality of standard or macro cells in which each CMOS cell conforms to the IDDQ test procedure parameters. In particular, for combinatorial logic and storage elements with clock inputs, the outputs go high when the inputs are asserted high and the outputs go low when the inputs are asserted low. Many CMOS cells with non-inverting logic and where each gate oxide interface of each transistor receives a test voltage during the high and low tests need not be further modified. Those cells with inverting logic or with any transistors in which the test parameters are not met are modified to include test transistors that receive either of the test signals TL and THB as previously described. In this manner, any logic function may be implemented using the IDDQ test library described herein.

Furthermore, any memory array incorporated into the design is also tested with slight modification of the address logic, with optional inclusion of bit line test logic for asserting non-inverted and/or inverted bit lines and with the assertion of one or more TEST signals. The TEST signals may be based on or otherwise include either or both of the TL and THB signals. The gate oxide interfaces of each transistor in each memory cell of the memory array receives a test voltage during the IDDQ test. Depending upon the type of memory array, the IDDQ test may need only a signal test portion to test all of the gate oxide interfaces of the array. Even if only one test portion is necessary, a second test portion may be conducted to test one or more P-N junctions of the memory array with a reversed-biased voltage.

It is appreciated that many large functional modules, such as embedded microprocessors or the like, are designed to include test modules such as the Joint Test Action Group (JTAG) test module or the like that may be configured to perform the IDDQ test described herein. In this manner, additional test signals need not be provided externally and may be asserted by the incorporated internal test module during a test procedure. In this manner, additional pins do not have to be added to an IC or module to conduct the IDDQ test. Alternatively, the existing pins may be utilized in any one of several methods known to those skilled in the art to access an embedded test module that asserts the test signals in accordance with the IDDQ test procedure as described herein. It is appreciated therefore that additional external pins do not have to be included to achieve the IDDQ test.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Although the invention has been described with respect to specific conductivity types or polarity of potentials, skilled artisans appreciated that conductivity types and polarities of potentials may be reversed.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A CMOS cell library, comprising:
   a plurality of CMOS cells, each CMOS cell including at least one input and at least one output;
   each CMOS cell including a plurality of transistors, each transistor comprising one of a PMOS transistor and an NMOS transistor;
   during a high test portion of a test mode in which each input is asserted high, each CMOS cell configured to assert its at least one output high;
   during a low test portion of the test mode in which each input is asserted low, each CMOS cell configured to assert its at least one output low; and
   each CMOS cell configured such that each gate oxide interface of each transistor of the CMOS cell receives a test voltage during the test mode.

2. The CMOS cell library of claim 1, wherein at least one CMOS cell includes a test transistor that receives a test signal.

3. The CMOS cell library of claim 1, further comprising:
   at least one of the plurality of CMOS cells includes at least two test transistors, each test transistor receiving one of first and second test signals; and
   the first and second test signals collectively indicating any one of a normal mode, a high test mode and a low test mode.

4. The CMOS cell library of claim 3, wherein the at least one CMOS cell includes an inverting logic cell that asserts at least one output low when each of its at least one input is asserted high during the normal mode.

5. The CMOS cell library of claim 1, wherein for each of the plurality of CMOS cells, each gate oxide interface of at least one transistor of the CMOS cell receives a test voltage during the high test and during the low test, each gate oxide interface of any remaining transistors receives a test voltage.

6. The CMOS cell library of claim 1, wherein the plurality of CMOS cells includes an inverter, an AND gate, a NAND gate, an OR gate, a NOR gate, an XOR gate, an XNOR gate and an inverter.

7. The CMOS cell library of claim 1, wherein the plurality of CMOS cells includes at least one storage element including at least one clock input.

8. The CMOS cell library of claim 1, wherein the at least one storage element comprises a flip-flop.

9. A CMOS circuit, comprising:
a plurality of transistors coupled together to form a logic circuit intended to perform a corresponding logic function in a normal mode, the logic circuit including at least one primary input, at least one output and first and second test inputs;
each transistor comprising either a PMOS transistor or an NMOS transistor;
the first and second test inputs indicating the normal mode, a high test mode and a low test mode; and
each gate oxide interface of each transistor of the logic circuit receiving a test voltage during either the high test mode when each primary input is asserted high or during the low test mode when each primary input is asserted low.

10. The CMOS circuit of claim 9, further comprising:
the logic circuit comprising a plurality of CMOS cells, each CMOS cell including at least one of the plurality of transistors and each CMOS cell including at least one input of a plurality of inputs and at least one output of a plurality of outputs;
the at least one primary input comprising a subset of the plurality of inputs;
each CMOS cell configured to assert each of its at least one output high when each of its at least one input is asserted high in the high test mode; and
each CMOS cell configured to assert each of its at least one output low when each of its at least one input is asserted low in the low test mode.

11. The CMOS circuit of claim 10, wherein the plurality of CMOS cells includes a plurality of logic gates.

12. The CMOS circuit of claim 10, wherein the logic circuit includes at least one storage element that includes at least one clock input.

13. The CMOS circuit of claim 12, wherein the at least one storage element comprises a flip-flop.

14. The CMOS circuit of claim 9, wherein the plurality of transistors includes at least two test transistors, each test transistor receiving one of the first and second test inputs.

15. The CMOS circuit of claim 14, wherein the at least one CMOS cell includes an inverting logic cell that asserts at least one output low when each of its at least one input is asserted high during the normal mode.

16. A method of testing a CMOS circuit, the CMOS circuit comprising a plurality of CMOS cells coupled together, each CMOS cell including at least one PMOS transistor and at least one NMOS transistor, the CMOS circuit including a plurality of test transistors, each test transistor receiving one of first and second test inputs indicating a normal mode, a high test mode and a low test mode, the CMOS circuit configured so that each gate oxide interface of each transistor receives a test voltage during one of the high test mode and the low test mode, the CMOS circuit having a plurality of primary inputs and configured so that during the high test mode when the primary inputs are forced high, each CMOS cell asserts each of its outputs high and during the low test mode when the primary inputs are forced low, each CMOS cell asserts each of its outputs low, the method of testing comprising:
forcing the primary inputs high;
asserting the first and second test inputs to conduct the high test mode;
sampling quiescent drain current of the CMOS circuit;
forcing the primary inputs low;
asserting the first and second test inputs to conduct the low test mode;
sampling quiescent drain current of the CMOS circuit; and
comparing sampled quiescent drain currents with a predetermined threshold current.

* * * * *